United States Patent
Twitchen et al.

(10) Patent No.: US 10,480,097 B2
(45) Date of Patent: Nov. 19, 2019

(54) SYNTHETIC CVD DIAMOND

(71) Applicant: ELEMENT SIX TECHNOLOGIES LIMITED, Didcot, Oxfordshire (GB)

(72) Inventors: Daniel James Twitchen, Didcot (GB); Andrew Michael Bennett, Didcot (GB); Rizwan Uddin Ahmad Khan, Didcot (GB); Philip Maurice Martineau, Didcot (GB)

(73) Assignee: Element Six Technologies Limited, Didcot, Oxfordshire (GB)

(*) Notice: Subject to any disclaimer, the term of this patent is extended or adjusted under 35 U.S.C. 154(b) by 0 days.

(21) Appl. No.: 16/352,934

(22) Filed: Mar. 14, 2019

(65) Prior Publication Data

US 2019/0211473 A1    Jul. 11, 2019

Related U.S. Application Data

(62) Division of application No. 12/968,862, filed on Dec. 15, 2010, now Pat. No. 10,273,598.

(60) Provisional application No. 61/289,282, filed on Dec. 22, 2009.

(51) Int. Cl.
| | |
|---|---|
| *C30B 29/04* | (2006.01) |
| *C30B 25/16* | (2006.01) |
| *C30B 25/18* | (2006.01) |
| *C30B 25/20* | (2006.01) |
| *C01B 32/25* | (2017.01) |

(52) U.S. Cl.
CPC .............. *C30B 29/04* (2013.01); *C01B 32/25* (2017.08); *C30B 25/165* (2013.01); *C30B 25/186* (2013.01); *C30B 25/20* (2013.01)

(58) Field of Classification Search
CPC ....... C30B 25/20; C30B 25/25; C30B 25/165; C30B 25/186
See application file for complete search history.

(56) References Cited

U.S. PATENT DOCUMENTS

| | | | |
|---|---|---|---|
| 4,959,201 | A | 9/1990 | Satoh et al. |
| 5,400,738 | A | 3/1995 | Shiomi et al. |
| 5,451,430 | A | 9/1995 | Anthony et al. |
| 5,672,395 | A | 9/1997 | Anthony et al. |
| 7,172,655 | B2 | 2/2007 | Twitchen et al. |
| 2004/0194690 | A1 | 10/2004 | Twitchen et al. |
| 2010/0015438 | A1 | 2/2010 | Williams et al. |

(Continued)

FOREIGN PATENT DOCUMENTS

| | | |
|---|---|---|
| EP | 0671482 A1 | 9/1995 |
| GB | 2430194 A | 3/2007 |
| JP | H07277890 A | 10/1995 |

(Continued)

OTHER PUBLICATIONS

Qi et al "Construction and analysis of C—H—N phase diagram for diamond chemical vapor deposition by simulation of gas-phase chemistry" Surface and Coatings technology 200 (2006) pp. 5268-5276.*

(Continued)

*Primary Examiner* — Robert M Kunemund
(74) *Attorney, Agent, or Firm* — Dean W. Russell; Clark F. Weight; Kilpatrick Townsend & Stockton LLP

(57) ABSTRACT

The present disclosure relates to methods for synthesizing synthetic CVD diamond material and high quality synthetic CVD diamond materials.

5 Claims, 11 Drawing Sheets

(56) References Cited

U.S. PATENT DOCUMENTS

2011/0015226 A1     1/2011    Nash et al.

FOREIGN PATENT DOCUMENTS

| WO | 2004022821 A1 | 3/2004 |
| WO | 20040046427 A1 | 6/2004 |
| WO | 2004063430 A1 | 7/2004 |
| WO | 2006127611 A2 | 11/2006 |
| WO | 20070081492 A2 | 7/2007 |
| WO | 20090045445 A1 | 4/2009 |
| WO | 20100149775 A1 | 12/2010 |

OTHER PUBLICATIONS

Nelder, J. A., et al., "A simplex method for function minimization," The Computer Journal, 1965, pp. 308-313, vol. 7.

Wyszecki, Gunter, et al., "Color Science: Concepts and Methods, Quantitative Data and Formulas," 1967, pp. 9 and 242-251, John Wiley & Sons, Inc., US.

Walker, John, "Optical absorption and luminescence in diamond," Reports on Progress in Physics, 1979, pp. 1605-1659, vol. 42, The Institute of Physics, UK.

Commission Internationale De L'Eclairage, "Colorimetry: Second Edition," 1986, pp. 27-33, No. 15.2, Central Bureau of the CIE, Vienna, Austria.

Hyde, J. S., et al., "Pseudo Field Modulation in EPR Spectroscopy," Applied Magnetic Resonance, 1990, pp. 483-496, vol. 1, Kazan Physical-Technical Institute.

Bachmann, Peter K., et al., "Towards a general concept of diamond chemical vapour deposition," Diamond and Related Materials, 1991, pp. 1-12, vol. 1, Elsevier Science Publishers B.V.

Chen, Chia-Fu, et al., "The role of hydrogen in diamond synthesis from carbon dioxide-hydrocarbon gases by microwave plasma chemical vapor deposition," Surface and Coatings Technology, 1992, pp. 368-373, vol. 54/55, Elsevier Sequoia.

Hutchings, Ian M., "Tribology: Friction and Wear of Engineering Materials," 1992, pp. 8-9, Edward Arnold, UK.

Kim, Yoon-Kee, et al., "The effects of oxygen on diamond synthesis by hot-filament chemical vapor deposition," Journal of Materials Science, Materials in Electronics, 1995, pp. 28-33, vol. 6, Chapman & Hall.

Samlenski, R., et al., "Characterisation and lattice location of nitrogen and boron in homoepitaxial CVD diamond," Diamond and Related Materials, 1996, pp. 947-951, vol. 5, Elsevier.

Lawson, Simon C., et al., "On the existence of positively charged single-substitutional nitrogen in diamond," J. Phys.: Condensed Matter, 1998, pp. 6171-6180, vol. 10, IOP Publishing Ltd., UK.

Chen, Z. Y., et al., "Growth mechanism of diamond by laser ablation of graphite in oxygen atmosphere," Physical Review B, Sep. 15, 2000, pp. 7581-7586, vol. 62, No. 11, The American Physical Society.

Pagel-Theisen, Verena, " Diamond Grading ABC, The Manual," 2001, pp. 64-67, Rubin & Son n.v., Belgium.

Howarth, David F., et al., "Generalization of the lineshape useful in magnetic resonance spectroscopy," Journal of Magnetic Resonance, 2003, pp. 215-221, vol. 161, Elsevier Science, USA.

May, P. W., et al., Microcrystalline, nanocrystalline, and ultrananocrystalline diamond chemical vapor deposition: Experiment and modeling of the factors controlling growth rate, nucleation, and crystal size, Journal of Applied Physics 101, 2007, pp. 053115-1-053115-9, vol. 101, American Institute of Physics.

Achard, J., et al., High quality MPACVD diamond single crystal growth: high microwave power density regime, Journal of Physics D: Applied Physics, 2007, pp. 6175-6188, vol. 40, IOP Publishing Ltd., UK.

Edmonds, A. M., et al., "Electron paramagnetic resonance studies of silicon-related defects in diamond," Physical Review B, 2008, pp. 245205-1-245205-11, vol. 77, The American Physical Society.

International Patent Application No. PCT/EP2010/069828, International Search Report dated Mar. 24, 2011, 3 pages.

Japanese Patent Application No. 2014-122151, Office Action dated May 7, 2015, 7 pages.

European Patent Application No. 10795323.4, Intention to Grant Patent dated Apr. 29, 2016, 6 pages.

European Patent Application No. 10795323.4, Decision to Grant Patent dated Jul. 7, 2016, 2 pages.

* cited by examiner

SYNTHETIC CVD DIAMOND

CROSS-REFERENCE TO RELATED APPLICATIONS

This application is a division of co-pending U.S. patent application Ser. No. 12/968,862, filed on Dec. 15, 2010, which claims the benefit of U.S. Provisional Patent Application No. 61/289,282, filed on Dec. 22, 2009, each of which is incorporated herein by reference in its entirety.

FIELD OF THE INVENTION

The present invention relates to a method for synthesizing synthetic CVD diamond material and high quality synthetic CVD diamond material.

BACKGROUND OF THE INVENTION

Diamond has a high hardness, good abrasion resistance, a low compressibility and a low coefficient of thermal expansion. Diamond can also have a very high coefficient of thermal conductivity and it can be an extremely good electrical insulator. This makes diamond a desirable material for many applications. For example, by making use of its thermal conductivity, diamond can be an excellent heat spreader material for electronic devices.

In certain electronic devices, the ability to dope diamond with nitrogen is important in order to pin the Fermi Level.

Synthetic diamond material synthesized using high pressure-high temperature (HPHT) synthesis techniques typically contains significant concentrations of nitrogen impurities, particularly single substitutional nitrogen ($N_s^0$), making it yellow. To avoid this, specific precautions may be taken to exclude nitrogen from the synthesis environment. In addition, diamond material produced using HPHT synthesis techniques exhibits strongly differential uptake of nitrogen impurity on the surfaces with different crystallographic orientation (which are the surfaces corresponding to differing growth sectors) that form during synthesis. The diamond material therefore tends to show zones with different colours, resulting from the differing nitrogen impurity concentrations in different growth sectors. In addition, it is hard to control the HPHT synthesis process sufficiently to give a uniform and desired nitrogen concentration throughout even a single growth sector within the synthesized diamond material. Furthermore, in HPHT synthesis, it is typical to see impurities resulting from the synthesis process and the catalysts used—examples would be inclusions comprising cobalt or nickel—features that can result in localised and inhomogeneous strain that degrade the mechanical, optical and thermal properties.

Using a CVD method (such as the process described in U.S. Pat. No. 7,172,655) it is possible to synthesize diamond material that contains significant concentrations (up to approximately 10 ppm [parts per million]) of $N_s^0$, but such diamond is normally brown in colour. This brown colour is believed to be due to the presence of defects other than $N_s^0$ incorporated in the material, thought to be caused by the addition of nitrogen to the CVD synthesis environment.

Intrinsic diamond material has an indirect bandgap of about 5.5 eV and is transparent in the visible part of the spectrum. Introducing defects, also referred to as "colour centres", which have associated energy levels within the band gap, gives the diamond a characteristic colour which is dependent on the type and concentration of the colour centres. This colour can result from absorption or photoluminescence, or a combination of the two, but generally absorption is the dominant factor. For example, it is well known that the $N_s^0$ defect causes absorption at the blue end of the visible spectrum which, by itself, causes the material to have a yellow colour. Similarly, it is known from Walker (J. Walker, 'Optical Absorption and Luminescence in Diamond', Rep. Prog. Phys., 42 (1979), 1605-1659) that when such yellow material is irradiated with high energy electrons to create vacancies (sites in the crystal lattice from which carbon atoms have been displaced), and annealed to cause the migration and eventual trapping of vacancies at nitrogen impurity atoms, NV centres are formed.

EP 0 671 482, U.S. Pat. No. 5,672,395 and U.S. Pat. No. 5,451,430 describe methods of reducing undesired defect centres in CVD diamond using a HPHT treatment, and U.S. Pat. No. 7,172,655 applies an annealing technique to reduce the brownness of a single crystal stone. The most complete removal of brown colour is achieved at annealing temperatures above about 1600° C. and generally requires diamond-stabilising pressures. However, such treatment is an expensive and complicated process in which yields can be seriously affected by cracking of stones etc. Furthermore, due to defect diffusion, such an annealing strategy is not necessarily consistent with avoiding nitrogen aggregation or with the fabrication of high performance electronic devices, where controlling the location of defects may be important. It is therefore considered desirable to be able to directly synthesize diamond material that is not brown but retains the desired high concentration of Ns0 using CVD methods.

There are many variations of the CVD method for the deposition of diamond which are now well established and have been described extensively in the patent and other literature. The method generally involves providing a source gas which, on dissociation to form a plasma, can provide reactive gas species such as radicals and other reactive species. Dissociation of the source gas is brought about by an energy source such as microwaves, RF energy, a flame, a hot filament or a jet based technique, and produces reactive gas species which are allowed to deposit onto a substrate and form diamond. Most of the recent art is focused on the use of hydrogen-based (H-based) plasmas, typically comprising $H_2$ with small additions of methane, typically in the range 1 to 10 volume % (see, for example, J. Achard et al, "High quality MPACVD diamond single crystal growth: high microwave power density regime", J. Phys. D: Appl. Phys., 40 (2007), 6175-6188), and oxygen or oxygen-containing species typically at the level of 0 to 3 volume % (for example Chia-Fu Chen and Tsao-Ming Hong, Surf. Coat. Technol., 54/55 (1992), 368-373). Hereinafter, oxygen and oxygen-containing species will be referred to collectively as "O-containing species" and are formed from the O-containing sources in the source gas.

Deliberate nitrogen additions into the synthesis environment are known (e.g. Samlenski et al, Diamond and Related Materials, 5 (1996), 947-951), typically with the purpose of enhancing the growth rate, or improving the quality of the diamond in some other way e.g. reducing stress and cracking (WO2004/046427). In these processes, whilst the addition of nitrogen into the synthesis environment does introduce some level of nitrogen into the solid, this is not the primary intent and the overall method is generally to minimise the inclusion of the nitrogen and the other associated defects in the diamond material that is synthesised. One exception is where the intent is specifically to create colour centres in the diamond material in the form of nitrogen defects (e.g. WO2004/046427), however such diamond material is of little use in the applications envisaged here, because of the high defects concentrations other than single substitutional nitrogen incorporated into the diamond material.

WO2004/063430 discloses high pressure and microwave power density (MWPD) to be important for the growth of synthetic CVD diamond material with a low defect concentration (i.e. what is generally termed 'high quality' synthetic CVD diamond material).

Whilst most of the recent art is focused on H-based plasmas comprising little or no O-containing species, there are also references to the importance of O-containing species in the etching of non-diamond carbon, in particular in the context of the synthesis of polycrystalline diamond by CVD methods (see, for example, Chen et al., Phys. Rev. B, vol 62 (2000), pages 7581-7586; Yoon-Kee Kim et al., J. Mater. Sci.: Materials in Electronics, vol 6 (1995), pages 28-33), and in synthesizing "high colour" diamond which is free from the impurities which arise when using H-based plasmas in synthesis processes runs at similar pressures and powers. Critically, in this area of prior art, nitrogen incorporated into the diamond material is considered to be one of the defects which is being minimised, and the methods taught reduce the nitrogen content along with other defect types (for example WO 2006/127611).

On the basis of the above, there remains a need for a CVD process for producing single crystal diamond in which the defect content can be controlled and the synthetic CVD diamond product thereof. There is also a need for high colour (i.e. high quality) synthetic CVD diamond material per se.

In particular, there is a need for a CVD diamond material, obtained by direct synthesis, with a relatively high nitrogen content that is uniformly distributed, and which is free of other defects, such as inclusions, normally associated with HPHT synthesis processes. Furthermore, there is a need for such CVD diamond material to have a colour which is not dominated by brown defects that do not contain nitrogen, but is instead dominated by the yellow hue due to the presence of single substitutional nitrogen. Likewise, there is a need for CVD diamond material where the electronic properties are dominated by single substitutional nitrogen, but not degraded by the other defects normally resulting from nitrogen in the growth process.

SUMMARY OF THE INVENTION

The present invention provides a chemical vapour deposition (CVD) method for synthesizing diamond material on a substrate in a synthesis environment, said method comprising:
  providing the substrate;
  providing a source gas;
  dissociating the source gas; and
  allowing homoepitaxial diamond synthesis on the substrate;
wherein the synthesis environment comprises nitrogen at an atomic concentration of from about 0.4 ppm to about 200 ppm;
and wherein the source gas comprises:
  a) an atomic fraction of hydrogen, $H_f$, from about 0.40 to about 0.75;
  b) an atomic fraction of carbon, $C_f$, from about 0.15 to about 0.30;
  c) an atomic fraction of oxygen, $O_f$, from about 0.13 to about 0.40;
wherein $H_f + C_f + O_f = 1$;
wherein the ratio of atomic fraction of carbon to the atomic fraction of oxygen, $C_f:O_f$, satisfies the ratio of about 0.45:1 < $C_f:O_f$ < about 1.25:1; wherein the source gas comprises hydrogen atoms added as hydrogen molecules, $H_2$, at an atomic fraction of the total number of hydrogen, oxygen and carbon atoms present of between about 0.05 and about 0.40; and
wherein the atomic fractions $H_f$, $C_f$ and $O_f$ are fractions of the total number of hydrogen, oxygen and carbon atoms present in the source gas.

The source gas comprises hydrogen, oxygen and carbon in the atomic fractions based on the total number of hydrogen, oxygen and carbon atoms present in the source gas of $H_f$, $O_f$ and $C_f$. The hydrogen may be provided by $H_2$ or other sources such as $CH_4$ etc.

The inventors have surprisingly found that by adding hydrogen as $H_2$ molecules to a source gas comprising O-containing sources (e.g. a $CH_4/CO_2$ source gas), it is possible to modify the diamond growth conditions to obtain synthetic CVD diamond material with both a high concentration of nitrogen in the form of $N_s^0$ and a low concentration of other defects.

CVD processes are advantageous as methods of synthesising single crystal diamond because they offer a more uniform, controllable method of producing synthetic diamond material. In contrast, HPHT techniques produce material with poorly controlled levels of $N_s^0$, and therefore great variation in concentration of $N_s^0$ between growth sectors, and material with other impurities and inclusions.

Without wishing to be bound by theory, it is believed that the usable ranges for the synthesis parameters of temperature, pressure and power density for the synthesis of CVD diamond material are reduced with the addition of O-containing sources to the source gas. Plasmas comprising O-containing species can be less stable and more prone to the formation of, for example, mono-polar arcs than H-based plasmas, and the microwave power density and pressures of processes using O-containing species in the plasma may therefore be forced to be lower than for H-based plasma processes. One advantage of the addition of some hydrogen, preferably in the form of $H_2$, into a process comprising O-containing species is that it can allow the use of a higher microwave power density and pressure. In this way, the operating pressure and microwave power density can both be increased before the synthesis process is disrupted by the tendency to form mono-polar arcs.

Herein, a "H-based plasma" is defined as a plasma comprising hydrogen, oxygen and carbon atoms in which the atomic fraction of hydrogen atoms ($H_f$), expressed as a fraction of the total number of hydrogen, oxygen and carbon atoms in the source gas that forms the plasma, is about 0.80 or greater, alternatively about 0.85 or greater, alternatively about 0.90 or greater. For example, a source gas composition of 600 sccm $H_2$, 30 sccm $CH_4$, (where "sccm" is "standard cubic centimetres" and these are the flows into the plasma containing chamber) has a hydrogen atomic fraction of $$((600\times2)+(30\times4))/((600\times2)+(30\times5))=0.98$$

and such a plasma would be a H-based plasma.

Herein, an "O-based plasma" is defined as a plasma comprising hydrogen, oxygen and carbon atoms in which the atomic fraction of oxygen atoms ($O_f$), expressed as a fraction of the total number of hydrogen, oxygen and carbon atoms in the source gas that forms the plasma, is about 0.10 or greater, alternatively about 0.15 or greater, alternatively about 0.20 or greater and the atomic fraction of hydrogen atoms ($H_f$) in the source gas that forms the plasma is about 0.75 or less, alternatively about 0.70 or less, alternatively about 0.60 or less, alternatively about 0.50 or less. For example a source gas composition of 290 sccm $CO_2$, 250 sccm $CH_4$, and 230 sccm $H_2$ has an oxygen atomic fraction ($O_f$) of (290×2)/((290×2)+(25×5)+(230×2))=0.22 and a hydrogen atomic fraction ($H_f$) of ((250×4)+(230×2))/((290×2)+(25×5)+(230×2))=0.56 and such a plasma would be an O-based plasma.

One reason why so much of the recent art relates to H-based plasmas (e.g. plasmas formed from a source gas mixture that is predominantly $H_2$) is thought to be that plasmas comprising large fractions of O-containing species (e.g. plasmas formed from the dissociation of $CO_2$/$CH_4$-based source gases), are more difficult to control at high pressures and high microwave power densities. Under some circumstances, the "quality" of diamond synthesized at a particular pressure and power density may be better (i.e. the defect content may be lower) for a plasma comprising a large fraction of O-containing species than for a H-based plasma under similar pressure and power density combination, and models generally assume this is based upon the superior etching ability of O-containing species. However, the H-based plasma can be run at significantly higher pressures and powers, which means that whilst the O-containing species may etch non-diamond carbon more efficiently "per atom", there are much lower fluxes of the etchant species at the diamond surface than for a higher power and pressure H-based plasma. These lower fluxes of the etchant species generally cause the defect content of the product to be higher for material synthesised in an optimised plasma comprising O-containing species compared to an optimised H-based plasma process.

Furthermore, hydrogen addition alone to $CO_2$/$CH_4$-based source gases has previously been shown to reduce the quality of the diamond material synthesized (Chia-Fu Chen and Tsao-Ming Hong, "The role of hydrogen in diamond synthesis from carbon dioxide-hydrocarbon gases by microwave plasma chemical vapor deposition", Surface and Coatings Technology, vol 54/55 (1992), pages 368-373).

In contrast, the inventors here have surprisingly found that by adding H-containing sources (in particular by the addition of hydrogen atoms as $H_2$) to the source gas in a carefully controlled amount, the pressure at which the CVD synthesis process can be run stably may be increased (i.e. the presence of hydrogen is believed to increase the stability of the plasma). This can allow for an increase in the synthesis pressure and microwave power density, and thus by combining substantial levels of oxygen, with the power and pressure regime that may be enabled by the presence of appropriate levels of hydrogen, conditions have been found which can enable significant levels of single substitutional nitrogen to enter the diamond lattice whilst at the same time minimising the other defects normally associated with nitrogen present in the synthesis environment. This can result in higher quality synthetic CVD diamond material.

Without wishing to be bound by theory, the inventors believe that under the conditions proposed in the present invention, the increased microwave power density allows more rapid etching of non-diamond carbon than is usually possible in plasmas comprising O-containing species. This rapid etching can arise from the superior etching ability of the O-containing species which may be substantially enhanced by the higher process pressures. It is not clear, and certainly was not predictable, that this would give the substantial selectivity in etching found in practice, giving extremely efficient etching of non-diamond carbon and those defects believed to cause brown colour, but allowing an unusually high level of nitrogen incorporation in the CVD diamond material. Thus, uniquely, the material produced by the process of the present invention shows significant absorption associated with single substitutional nitrogen, but very low absorption associated with brownness arising from defects other than single substitutional nitrogen thought to be caused by the addition of nitrogen to the CVD synthesis environment.

The present invention further provides synthetic CVD diamond material produced by the method of the present invention.

The present invention further provides synthetic CVD diamond material comprising single substitutional nitrogen ($N_s^0$) at a concentration of greater than about 0.5 ppm and having a total integrated absorption in the visible range from 350 nm to 750 nm such that at least about 35% of the absorption is attributable to $N_s^0$.

Preferably the CVD diamond material of the invention is single crystal CVD diamond material.

The present invention further provides a gemstone comprising synthetic CVD diamond material of the present invention. The present invention further provides the use of synthetic CVD diamond material of the present invention as a gemstone. These gemstones are advantageous because the defects present in the synthetic CVD diamond material of the present invention provide a yellow colour that is similar to the yellow colour of a yellow-coloured natural diamond (e.g. a so-called "Cape Yellow" diamond), making the gemstones more attractive to those who have a preference for natural-looking colours.

The present invention further provides an electronic device comprising synthetic CVD diamond material of the present invention.

The present invention further provides the use of synthetic CVD diamond material of the present invention in an electronic device. These electronic devices are advantageous because the high and uniform concentration of $N_s^0$ in the substrate upon which the device is fabricated efficiently pins the Fermi level whilst providing a substrate upon which subsequent epilayers of intrinsic or doped diamond with low extended defect density can be deposited.

As used herein, where diamond material of a particular colour grade is described, the colour grade scale referred to is that of the Gemological Institute of America ("GIA") wherein "high colour" is a grade of "L" or higher (i.e. grades D, E, F, G, H, I, J, K or L), GIA grade "D" is the "highest colour", that is the closest to being completely colourless. The meaning of colour within the art of colour-grading of diamond is well understood and diamonds are graded by the same methods against the same scale in gem grading laboratories worldwide. The relationship between the perceived colour and the grade is given in V. Pagel-Theisen, "Diamond Grading ABC The Manual", 9th Edition (2001), Rubin & Son, Antwerp, Belgium, page 61 (fold-out table).

The quantitative measurement of colour in diamond is well established and is described using the "CIE L*a*b* Chromaticity Coordinate" and its use in diamond is described in WO 2004/022821. a* and b* are plotted as x and y axes of a graph and the hue angle is measured from the positive a* axis towards the positive b* axis. Thus a hue angle of greater than 90° and less than 180° lies in the upper left quadrant of the a*b* graph. In this scheme for describing colour, L* is the lightness and a fourth coordinate C* is the saturation.

In the context of this invention, the term "quality" is used to mean "fitness for purpose" and therefore a material when used for a specific application is considered to be of "higher quality" than another material, if it is providing a better or improved technical solution to the problem being solved.

It is common in the art to refer to the "synthesis" of diamond material as the "growth" of diamond material. Such terms as "growth rate" and "growth sector" should therefore be interpreted with this in mind.

The synthesis environment comprises the source gas which itself comprises carbon atoms, hydrogen atoms and oxygen atoms in the form of molecules, atoms, radicals or ions. There may be other species deliberately added to the synthesis environment (in particular by adding these species to the source gas) in larger or smaller quantities, such as inert gases (e.g. helium, neon, argon, krypton, etc.) or nitrogen. In addition, there may be impurities in the source gas mixture.

The proportion of atoms in the synthesis environment that are C, H and O may be about 70% or greater, alternatively about 80% or greater, alternatively about 85% or greater, alternatively about 90% or greater, alternatively about 95% or greater, alternatively about 98% or greater.

The synthesis environment may further comprise one or more inert gases selected from helium, neon, argon, krypton and xenon. These inert gases may be added to the synthesis environment by the source gas, i.e. they are present in the source gas. Inert gases may be present in the source gas at an atomic fraction, $X_f$, of between about 0 and about 0.5, alternatively between about 0 and about 0.3, alternatively between about 0 and about 0.2, alternatively between about 0 and about 0.1, alternatively between about 0 and about 0.05; where $X_f + H_f' + C_f' + O_f' = 1$. The atomic fractions $H_f'$, $C_f'$ and $O_f'$ are fractions of the total number of hydrogen, oxygen, carbon and inert gas atoms present in the source gas. Clearly, when $X_f = 0$; $H_f = H_f'$, $C_f = C_f'$ and $O_f = O_f'$. Since the inert gases are inert from a chemical viewpoint, they do not have a role in the chemical processes that occur in the plasma and can be ignored in this respect. However, the presence of inert gases can affect the physical characteristics of the plasma, such as its thermal conductivity, or may act as third bodies that can facilitate chemical reactions between other species without actually participating chemically in the reaction. Consequently the inventors, without being bound by any particular theory, believe that the presence of inert gases, in particular Ar, in small quantities, whilst not necessary for the current invention, may have beneficial effects.

The synthesis environment comprises the source gas, wherein the source gas comprises hydrogen atoms added as hydrogen molecules, $H_2$, at an atomic fraction expressed as a fraction of the total number of hydrogen, carbon and oxygen atoms present of from about 0.05 to about 0.40, alternatively from about 0.10 to about 0.35, alternatively from about 0.15 to about 0.30, alternatively from about 0.05 to about 0.10, alternatively from about 0.10 to about 0.15, alternatively from about 0.15 to about 0.20, alternatively from about 0.20 to about 0.25, alternatively from about 0.25 to about 0.30, alternatively from about 0.30 to about 0.35, alternatively from about 0.35 to about 0.40. The remaining hydrogen atoms (i.e. those not from the added $H_2$ molecules) are from other sources such as $CH_4$ etc.

The hydrogen in the source gas is in the form of hydrogen ($H_2$) or hydrogen-containing sources (hereinafter collectively referred to as H-containing sources), e.g. $H_2$, $CH_4$ and other hydrocarbon species including hydrocarbons that also contain oxygen such as aldehydes, ketones etc.

The carbon in the source gas is in the form of carbon-containing sources, e.g. CO (carbon monoxide), $CO_2$ (carbon dioxide), $CH_4$, other hydrocarbons (alkanes such as ethane, propane, butane etc; alkenes such as ethene, propene etc; alkynes such as ethyne, propyne etc), oxygen containing hydrocarbons such as alcohols, aldehydes, esters, carboxylic acids, etc.

The oxygen in the source gas is in the form of oxygen or oxygen-containing sources (hereinafter collectively referred to as O-containing sources), e.g. $O_2$, $O_3$ (ozone), CO, $CO_2$, oxygen-containing hydrocarbons such as alcohols, aldehydes, esters, ethers, carboxylic acids, etc.

Since the source gas mixture is essentially broken up into its constituent atoms in the synthesis process and these components will reform into a mixture of species that is, or is close to, the thermodynamic equilibrium composition for the particular mixture of atoms, the choice of the molecular species that make up the source gas mixture is dictated by the requirement to achieve a particular plasma composition and the ability to strike and maintain a stable plasma in the chosen mixture of molecules. The choice of gases forming the source gas mixture is to some extent further dictated by cost, availability, purity and ease of handling; for example, $CH_4$, CO, $CO_2$, $H_2$ and $O_2$ are all readily available as stable, bulk gases in a range of chemical purities and therefore might be preferred.

On dissociation of the source gas, these sources form hydrogen or hydrogen-containing species (collectively H-containing species), carbon-containing species and oxygen or oxygen-containing species (collectively O-containing species) respectively in the plasma. Typically, the dissociated source gas will comprise hydrogen radicals (H•), carbon monoxide radicals (CO•) and two-carbon radical species (e.g. $C_2H_x^*$ where x less than 6). The presence of these species may be determined by techniques such as optical emission spectroscopy ("OES").

The source gas may be comprised of molecular species such CO, $CO_2$, $CH_4$ and $H_2$ such that the atomic fractions of carbon, $C_f$, hydrogen, $H_f$, and oxygen, $O_f$, in the source gas are in the following ranges:

$0.15 < C_f < 0.30$, alternatively $0.18 < C_f < 0.28$, alternatively $0.20 < C_f < 0.25$;

$0.40 < H_f < 0.75$, alternatively $0.42 < H_f < 0.72$, alternatively $0.45 < H_f < 0.70$; and $0.13 < O_f < 0.40$, alternatively $0.15 < O_f < 0.38$, alternatively $0.18 < O_f < 0.35$.

It is possible to represent the position of any source gas composition containing the above amounts of C, H and O atoms on a so-called "Bachman Diagram" (P. K. Bachmann et al, "Towards a general concept of diamond chemical vapour deposition", Diamond and Related Materials, 1 (1991), 1-12), an isothermal slice from a modified ternary phase diagram. Whilst the original Bachmann Diagram has merit, the present inventors have found that using an isothermal slice from a more-conventional C—H—O ternary phase diagram, in which the atomic fraction of C, H and O are plotted, is more useful (FIG. 1). In FIG. 1, the upper and lower limits of $H_f$ are labelled (2) and (4) respectively, the lower and upper limits of $C_f$ are labelled (6) and (8) respectively and the lower and upper limits of $O_f$ are labelled (10) and (12). The shaded region (14) of FIG. 1 enclosed by these sets of lower and upper limits therefore defines the source gas compositions of the present invention.

By the use of a ternary phase diagram, as shown in FIG. 1, atomic compositions can be compared regardless of the molecular source of the atomic species; this is particularly relevant to plasma CVD processes where the species in the plasma are essentially in thermodynamic equilibrium based on the atomic fractions of atoms present, regardless of the molecular sources of those atoms.

The atomic fractions of carbon, hydrogen and oxygen are fractions of the total number of hydrogen, oxygen and carbon atoms present in the source gas and therefore satisfy the relationship $C_f+H_f+O_f=1$, irrespective of whether any other species (e.g. inert gases) are present.

The $C_f$:$O_f$ ratio is in the range $0.45:1<C_f$:$O_f<1.25:1$, alternatively $0.50:1<C_f$:$O_f<1.20:1$, alternatively $0.55:1<C_f$:$O_f<1.15:1$.

Alternatively, the $C_f$:$O_f$ ratio may be in the range $0.54:1<C_f$:$O_f<1.20:1$, alternatively $0.61:1<C_f$:$O_f<1.18:1$, alternatively $0.72:1<C_f$:$O_f<1.15:1$.

Examples of compositions that meet the above criteria are disclosed in the Examples.

The surface of the substrate on which the synthetic CVD diamond material is synthesized is termed the growth surface of the substrate. The surface of the synthetic CVD diamond material that is attached to the growth surface of the substrate during growth is known as the "substrate side" (also known as the "nucleation side", "nucleation face", "nucleation surface" or "substrate surface"). The surface of the synthetic CVD diamond material substantially parallel to the nucleation side onto which further CVD diamond material is deposited during the CVD diamond material synthesis is known as the "growth side" (also known as the "growth face" or "growth surface").

The substrate may be a diamond substrate suitable for use in homoepitaxial diamond synthesis. Therefore, the substrate itself may be a type Ia, type IIa or type IIb natural diamond, a type Ib or type IIa HPHT synthetic diamond or a CVD synthesised diamond. The CVD synthesised diamond substrate may be a single crystal CVD diamond which may also be homoepitaxial (also known herein as a homoepitaxial substrate). Therefore, the substrate may have, itself, been synthesized on an initial substrate.

The diamond substrate may have a (001) growth surface, which is a major face of the substrate, and may be bounded by edges lying substantially along the <100>directions. The substrate may also have a growth surface with a normal that is within about 10° of the [001] direction, alternatively within about 5° of the [001] direction, alternatively within about 4° of the [001] direction, alternatively within about 3° of the [001] direction. The edges of the substrate may be within about 10° of the <100> directions, alternatively within about 5° of the <100> directions, alternatively within about 3° of the <100> directions. The edges of the substrate may be within about 10° of the <110> directions, alternatively within about 5° of the <110> directions, alternatively within about 3° of the <110> directions. The growth surface of the substrate may be substantially the {001}, {101}, {113}, {311} or {111} surface, and is generally the {001} surface.

The following convention is applied to the crystallography of diamond to enable the growth surface of a substrate to be distinguished from the other surfaces. As used herein, for a typical substrate having the shape of a rectangular parallelepiped (for which all faces are nominally part of the {100} form) with two opposed major and four smaller faces, the opposed major faces are the (001) and (00$\bar{1}$) faces (collectively referred to as {001}) and the surface upon which growth occurs is taken to be the (001) surface. The growth direction is thus the [001] direction and the edges of the substrate are parallel to the [100] and [010] directions.

As used herein, the term "substantially" when referring to a direction, e.g. a crystallographic direction or a direction with respect to the growth surface of the substrate, means within about 10° of said direction, alternatively within about 5° of said direction, alternatively within about 4° of said direction, alternatively within about 3° of said direction.

It is important for the production of high quality CVD diamond material that the growth surface of the diamond substrate is substantially free of crystal defects. In this context, crystal defects primarily means dislocations and microcracks, but also includes twin boundaries, stacking faults, point defects, low angle boundaries and any other disruption to the crystal lattice.

The nature of the defects that are responsible for the brown colour of diamond are not properly understood at present but are believed by the inventors to be related to the presence of multivacancy clusters that are grown-in under large growth rates, concomitant with the addition of nitrogen to the plasma via a hydrogen/methane ($H_2/CH_4$) source gas. Such clusters are thermally unstable and may be removed to some degree, though often not completely, by high-temperature treatment (i.e. annealing). It is believed that smaller vacancy-related defects, such as NVH (nitrogen-vacancy-hydrogen) defects that are made up of nitrogen and hydrogen and a missing carbon atom, may be partially responsible for the brown colour and these defects may also be removed by high-temperature treatment.

The defect density is most easily characterised by optical evaluation after using a revealing plasma or chemical etch (referred to collectively as a "revealing etch"). The revealing etch will be optimised to reveal the defects in the diamond substrate and may be a brief anisotropic plasma etch of the type described below. In general, two types of defect can be revealed:

1) Those intrinsic to the diamond substrate material quality. In selected natural diamond substrates, the density of these defects can be as low as 50/mm$^2$, with more typical values being 10$^2$/mm$^2$, whilst in other diamond materials, the density of these defects can be 10$^6$/mm$^2$ or greater.
2) Those resulting from polishing, including dislocation structures and microcracks in the form of "chatter tracks" along polishing lines. The density of these defects can vary considerably over a sample, with typical values ranging from about 10$^2$/mm$^2$, up to more than 10$^4$/mm$^2$ in poorly polished regions or substrates.

The preferred low density of defects is thus such that the density of surface etch features related to defects, as described above, is below 5×10$^3$/mm$^2$, and may be below 10$^2$/mm$^2$.

The defect level at and below the growth surface of a diamond substrate may be minimised by careful preparation of the substrate. Here preparation includes any process applied to the substrate material from mine recovery (in the case of natural diamond) or synthesis (in the case of synthetic diamond material) as each stage can influence the defect density within the substrate material at the plane which will ultimately form the growth surface of the substrate when processing to form the substrate is complete. Particular processing steps may include conventional diamond processes such as mechanical sawing, lapping and polishing conditions, and less conventional techniques such as laser processing or ion implantation and lift off techniques, chemical/mechanical polishing, and both liquid and plasma chemical processing techniques. In addition, the roughness of the surface, as described by its Ra value, should be minimised; typical values prior to any plasma etch are a few nanometres, i.e. 10 nm or less.

The $R_a$ (sometimes referred to as "$R_A$" or "centre line average" or "c.l.a.") refers to the arithmetic mean of the absolute deviation of surface profile from the mean line measured by stylus profilometer, measured over a length of 0.08 mm and measured according to British Standard BS 1134 Part 1 and Part 2. The mathematical description of $R_a$ (from "Tribology", I. M. Hutchings, Pub. Edward Arnold (London), 1992, pages 8-9) is:

$$R_a = \frac{1}{L}\int_0^L |y(x)|dx$$

(arithmetic mean of the absolute deviation of surface profile measured by stylus profilometer, generally over 0.08 mm length). Measurement of $R_a$ using a stylus profilometer is well known in the art and there are many instruments suitable for making such measurements; for example, the inventors have used a "Taylor Hobson FormTalysurf 50", (Taylor Hobson Ltd, Leicester, UK).

The surface damage of the growth surface of a diamond substrate may be minimised by providing an anisotropic etch, for example a plasma etch.

Anisotropic etching involves the removal of material from the growth surface of the substrate to provide a growth surface which is substantially flat and also free or substantially-free of residual damage features arising from any prior processing steps, in particular mechanical processing steps.

The anisotropic plasma etch may be an oxygen etch using an etching gas comprising hydrogen and oxygen. Alternatively, the plasma etch may be a hydrogen etch. In a further alternative, the plasma etch may comprise both an oxygen and a hydrogen etch, wherein in some cases, the oxygen etch is followed by the hydrogen etch. It is advantageous for the oxygen etch to follow the hydrogen etch since the hydrogen etch is less specific to crystal defects and rounds off any angularities caused by the oxygen etch (which aggressively attacks such crystal defects) and provides a smoother, better growth surface on the substrate.

The duration and temperature of the anisotropic plasma etch are selected to enable any damage to the surface of the substrate to be removed, and for any surface contaminants to be removed. The surface of the substrate may have been damaged by processing steps undertaken before the plasma etch. Generally, the plasma etch does not form a highly roughened surface on the substrate and does not etch extensively along extended defects (such as dislocations) which intersect the surface and thus cause deep pits.

The anisotropic etch may be an in situ plasma etch. In principle this etch need not be in situ, nor immediately prior to the synthesis of the diamond material, but the greatest benefit is achieved if it is in situ, because it avoids any risk of further physical damage or chemical contamination of the substrate. An in situ etch is also generally most convenient when the synthesis of the diamond material is also plasma based. The plasma etch can use similar conditions to those used for the synthesis of the diamond material, but with the absence of any carbon-containing source gas and generally at a slightly lower temperature to give better control of the etch rate.

The anisotropic oxygen etch conditions may be a pressure of from about 50×102 Pa to about 450×102 Pa, an etching gas containing an oxygen content of from about 1% to about 4%, an argon content of about 30% or less and the balance hydrogen, all percentages being by volume, a substrate temperature of from about 600° C. to about 1100° C. (generally about 800° C.), and an etch duration of from about 3 minutes to about 60 minutes.

The anisotropic hydrogen etch conditions may be a pressure of from about 50×102 Pa to about 450×102 Pa, an etching gas containing hydrogen and about 30% or less by volume argon, a substrate temperature of from about 600° C. to about 1100° C. (generally about 800° C.), and an etch duration of from about 3 minutes to about 60 minutes.

Alternative methods for the etch not solely based on argon, hydrogen and oxygen may be used, for example, those utilising halogens, other inert gases or nitrogen.

For the duration of the synthesis process, the substrate may be maintained at a temperature of from about 750° C. to about 1000° C., alternatively from about 750° C. to about 950° C., alternatively from about 780° C. to about 870° C.

As used herein, the "synthesis environment" is the part of the synthesis apparatus in which CVD diamond material synthesis takes place. It is generally down stream of a gas delivery system and up stream of a means of controlling the pressure within the synthesis environment, for example a 'throttle valve' controlling the gas flow impedance and a vacuum pump. The synthesis environment comprises a source gas and any gases due to leaks, back-streaming through vacuum pumps and desorption from the synthesis apparatus. Therefore, changes in the composition of a source gas provided by the gas delivery system are reflected in the gas composition of the synthesis environment. However, the gas composition in the synthesis environment is also affected by other factors such as the synthesis process. In principle the gas delivery system may have more than one point of entry into the synthesis environment, such that the composition of the source gas, provided by the gas delivery system, does not pre-exist as a mixture within the gas delivery system, but is determined by the relative flows of the gases being added into the synthesis environment by the gas delivery system.

All references herein to the gas composition in the synthesis environment are based on the sum of the gases added to the synthesis environment by the gas delivery system and any gases due to leaks, back-streaming through vacuum pumps and desorption from the synthesis apparatus. This can be determined by activating the gas delivery system to deliver the source gas to the synthesis system where the CVD diamond material synthesis would take place, any gases due to leaks, back-streaming through vacuum pumps and desorption from the synthesis apparatus will also be generated at this point. The gas composition in the synthesis environment can then be determined in the synthesis system where the CVD diamond material synthesis would take place without actually synthesizing any CVD diamond material.

The concentrations of the gases in the synthesis environment are controlled by altering the concentration of the gases in the source gas before inputting the source gas into the synthesis apparatus. Therefore, the measurements given herein for gas concentrations in the source gas have been determined by the source gas composition before it is inputted into the synthesis apparatus and have not been measured in the synthesis environment in situ (i.e. inside the synthesis apparatus). The person skilled in the art would be able to calculate the required flow of any separate gases that would be needed to provide the required concentration in the source gas.

The synthesis environment comprises nitrogen at an atomic concentration of from about 0.2 ppm to about 100 ppm, alternatively from about 0.5 ppm to about 50 ppm, alternatively from about 1 ppm to about 30 ppm, alternatively from about 2 ppm to about 20 ppm, alternatively from about 5 ppm to about 20 ppm. Preferably the atomic nitrogen content of the synthesis environment is from about 5 ppm to about 20 ppm. The nitrogen concentration may be determined as the atomic fraction nitrogen, N, in the total gas flow of the source gas; for example a gas flow of 1000 sccm (standard cubic centimetres) of $H_2$ and 150 sccm of $H_2$ containing 100 ppm of $N_2$ would have an atomic nitrogen content of:

(150×100×2)/(1000×2+150×2)=13 ppm

The nitrogen in the synthesis environment may be provided by nitrogen (i.e. $N_2$) or nitrogen-containing gases (e.g. ammonia ($NH_3$), hydrazine ($N_2H_4$) etc).

The method of the present invention additionally comprises dissociating the source gas. Dissociation of the source gas in the synthesis environment is brought about by an energy source such as microwave, RF (radio frequency) energy, a flame, a hot filament or jet based technique and the reactive gas species so produced (also herein termed the "plasma") are allowed to deposit onto the growth surface of a substrate and form the synthetic CVD diamond material. In one embodiment, the energy source is a microwave energy source. The frequency of the microwave source may be from about 800 MHz to about 2500 MHz and is generally one of the industrial heating frequencies of which 2450 MHz, 915 MHz and 896 MHz are examples.

The process of the present invention may be carried out at a pressure of about 8,000 Pa (60 Torr) or greater, alternatively about 10,600 Pa (80 Torr) or greater, alternatively about 13,300 Pa (100 Torr) or greater, alternatively about 16,000 Pa (120 Torr) or greater.

The process of the present invention may be carried out at a pressure of from about 10,600 Pa (about 80 Torr) to about 40,000 Pa (about 300 Torr), alternatively about 12,000 Pa (about 90 Torr) to about 40,000 Pa (about 300 Torr), alternatively about 13,300 Pa (about 100 Torr) to about 40,000 Pa (about 300 Torr), alternatively about 10,600 Pa (about 80 Torr) to about 26,600 Pa (about 200 Torr), alternatively about 12,000 Pa (about 90 Torr) to about 24,000 Pa (about 180 Torr), alternatively about 13,300 Pa (about 100 Torr) to about 20,000 Pa (about 150 Torr). The method of the present invention surprisingly allows these high pressures to be used in combination with a source gas comprising O-containing sources allowing more efficient etching of non-diamond carbon and defects, as discussed above, thereby allowing the synthesis of high quality CVD diamond material.

In one embodiment, the process of the present invention may be carried out at a pressure of from 13,300 Pa (100 Torr) to 40,000 Pa (300 Torr).

The inventors have found that there is a pressure, $P_{arc}$, above which there is a greatly increased risk of the formation of monopolar arcs in the plasma that may disrupt or stop the synthesis process, which is related to the atomic fraction of hydrogen, $H_f$, in the source gas. The inventors have found that $P_{arc}$ is given by:

$P_{arc}=170(H_f+0.25)+X$ where the units of $P_{arc}$ are Torr (1 Torr=133.3 Pa). Although this equation results in a $P_{arc}$ measured in Torr, the skilled person would know how to convert it to a measurement in Pascals. X represents the fact that this upper pressure limit may vary slightly dependent on the given reactor configuration and process conditions other than $H_f$, but for any given reactor and process it is a simple exercise to establish where this limit lies by varying the pressure and observing the pressure of formation of unipolar arcs. The inventors have found that X typically ranges from about 20 to about −50; alternatively about 20 to about −30; alternatively about 10 to about −30; alternatively about 20 to about −20; alternatively about 10 to about −20; alternatively about 10 to about −10; alternatively about 5 to about −10; alternatively about 5 to about −5. Alternatively X may be about 10, alternatively about 5, alternatively about 0, alternatively about −5, alternatively about −10.

Having determined a value for X, this expression has been found to hold over a range of $H_f$ values of between about 0.4 and about 0.95 (e.g. between about 0.4 and about 0.75), and for a wide range of $C_f$ and $O_f$ making up the balance of the synthesis environment. In addition, the inventors have found the addition of one or more inert gases in the atomic fractions previously disclosed, does not have a significant impact on the pressure limit $P_{arc}$.

The inventors have found that the preferred pressure of operation in the method of this invention exceeds $P_{lower}$ where $P_{lower}=P_{arc}-Y$, where the units of $P_{lower}$ and Y are Torr and the value of Y is about 50 Torr or less, alternatively about 40 Torr or less, alternatively about 30 Torr or less, alternatively about 20 Torr or less, alternatively about 10 Torr.

In one embodiment, the method of the present invention is carried out at a pressure greater than $P_{lower}$ Torr, where $P_{lower}=P_{arc}-Y$ and $P_{arc}=170(H_f+0.25)+X$, where Y is about 50 Torr, X is about 0 Torr and $P_{arc}$ is the pressure of the onset of unipolar arcing in the process.

The pressure of operation may be about 120 Torr or more, alternatively about 130 Torr or more, alternatively about 140 Torr or more, alternatively about 150 Torr or more, alternatively about 160 Torr or more. These operating pressures may be useful when $H_f$ is 0.75.

The preferred pressure of operation lies at or below $P_{arc}$, and for reasons of process stability, preferably a small but significant pressure below $P_{arc}$. This pressure is referred to as "$P_{upper}$" and is measured in Torr.

Thus, the inventors have found that the preferred pressure of operation in the method of this invention is given by $P_{upper}=P_{arc}-Z$, where Z is about 0 Torr, alternatively Z is about 5 Torr, alternatively Z is about 10 Torr.

It will be appreciated by the skilled person that any of the X, Y and Z values provided above may be combined.

In one embodiment, the method of the present invention is carried out at a pressure less than or equal to $P_{upper}$, wherein $P_{upper}=P_{arc}-Z$, and $P_{arc}=170(H_f+0.25)+X$, where X is from about 20 to about −50, $P_{arc}$ is P the pressure of the onset of unipolar arcing in the process and Z is about 0 Torr.

In one embodiment, the process is carried out at a pressure less than or equal to $P_{upper}$, wherein $P_{upper}=P_{arc}-Z$ and $P_{arc}=170(H_f+0.25)+X$, where X is about 0, Z is about 0 Torr and $P_{arc}$ is the pressure of the onset of unipolar arcing in the process.

The pressure of operation, $P_{upper}$, may be about 170 Torr or less, alternatively about 165 Torr or less, alternatively about 160 Torr or less. These operating pressures may be useful when $H_f$ is 0.75.

As mentioned previously, the present invention provides synthetic CVD diamond material comprising $N_s^0$ at a concentration of greater than about 0.5 ppm (about $8.8 \times 10^{16}$ atoms per $cm^3$) and having a total integrated absorption in the visible range from 350 nm to 750 nm such that at least about 35% of the absorption is attributable to $N_s^0$.

Alternatively, the concentration of $N_s^0$ in the synthetic CVD diamond material may be greater than about 1.0 ppm, alternatively greater than about 1.5 ppm, alternatively greater than about 1.8 ppm, alternatively greater than about 2.0 ppm, alternatively greater than about 2.5 ppm, alternatively greater than about 3.0 ppm, alternatively greater than about 3.5 ppm, alternatively greater than about 4.0 ppm, alternatively greater than about 5.0 ppm, alternatively greater than about 7.0 ppm, alternatively greater than about 10.0 ppm, alternatively greater than about 15.0 ppm, alternatively greater than about 20.0 ppm, alternatively greater than about 25.0 ppm, alternatively greater than about 50.0 ppm, alternatively greater than about 75.0 ppm, alternatively greater than about 100.0 ppm.

Preferably the concentration of $N_s^0$ is about 200 ppm or less.

Preferably the concentration of $N_s^0$ in the synthetic CVD diamond material is greater than about 1.0 ppm and less than about 25 ppm, alternatively greater than about 2.0 ppm and less than about 15 ppm.

Since diamond is a wide band gap semiconductor, diamond material, and in particular diamond material containing defects, does not necessarily have a well-defined Fermi level. At room temperature (i.e. about 300 K), charge that is initially trapped at a defect having an energy level that is relatively shallow compared with either the valence band maximum or the conduction band minimum, will reach an equilibrium distribution via transport after thermal excitation to the valance or conduction bands. However, diamond material may contain defects having energy levels that are relatively deep within the band gap such that, at room temperature, there is a low probability that electrons will be thermally excited between the valence band and the defect or between the defect and the conduction band. When such defects are present, the charge distribution across the various defects may depend on the thermal and excitation history of the sample. In such cases, to the extent that the optical absorption properties of the material depend on the charge state of defects within it, they will also depend on the thermal and excitation history of the sample. For example, the proportions of isolated substitutional nitrogen defects that exist in the neutral charge state may depend on the prior thermal and excitation history of the sample and therefore the proportion of the total optical absorption that is attributable to this neutral defect will also depend on the history of the sample.

For the avoidance of doubt, when the history of the sample is not specified, the properties of the material described in this invention should be taken to be properties that can be measured at room temperature (i.e. about 300 K) with no additional excitation of the sample during the measurement other than that required in making the measurement.

Preferably the properties are measured after the sample has been irradiated with light from a deuterium lamp under the following conditions:
(a) distance between the sample and the lamp of about 10 cm or less;
(b) lamp operating electrical power of at least 10 Watts; and
(c) a duration of between about 5 minutes and about 60 minutes.

In particular, the properties are measured after the sample has been irradiated with light from a deuterium lamp under the following conditions:
(d) distance between the sample and the lamp of 8 cm;
(e) lamp operating electrical power of 10 Watts; and
(f) a duration of 10 minutes.

Deuterium lamps (also known as "deuterium arc lamps") are widely used in spectroscopy where a continuous output is required between wavelengths of about 180 nm and about 370 nm.

The concentration of $N_s^0$ present in the synthetic CVD diamond material of the present invention may be measured using the 270 nm peak using UV-visible absorption spectroscopy. The technique of UV-visible absorption spectroscopy is well-known in the art.

The concentration of $N_s^0$ in synthetic CVD diamond material may be found by measuring infrared absorption peaks at wavenumbers of 1332 $cm^{-1}$ and 1344 $cm^{-1}$. Using a spectrometer with a resolution of 1 $cm^{-1}$, the conversion factors between the absorption coefficient values in $cm^{-1}$ for the peaks at 1332 $cm^{-1}$ and 1344 $cm^{-1}$ and the concentrations of single nitrogen in the positively-charged and neutral states respectively are 5.5 (S. C. Lawson et al., J. Phys. Condens. Matter, 10 (1998), 6171-6181) and 44. However, it must be noted that the value derived from the 1332 $cm^{-1}$ peak is only an upper limit.

Alternatively, the total concentration of nitrogen may be determined using secondary ion mass spectroscopy (SIMS). SIMS has a lower detection limit for nitrogen in diamond of approximately 0.1 ppm and its use is well-known in the art. For synthetic diamond produced by a CVD method, the vast majority of nitrogen present in the solid is in the form of neutral single substitutional nitrogen, $N_s^0$, and therefore, whilst SIMS measurements of the total nitrogen concentration inevitably provide an upper limit to the concentration of $N_s^0$, they typically also provide a reasonable estimate of its actual concentration.

Alternatively, the concentration of $N_s^0$ may be determined by electron paramagnetic resonance ("EPR"). Whilst the method is well-known in the art, for completeness, it is summarised here. In measurements conducted using EPR, the abundance of a particular paramagnetic defect (e.g. the neutral single-substitutional nitrogen defect, $N_s^0$) is proportional to the integrated intensity of all the EPR absorption resonance lines originating from that centre. This permits the concentration of the defect to be determined by comparing the integrated intensity to that which is observed from a reference sample, provided care is taken to prevent or correct for the effects of microwave power saturation. Since continuous wave EPR spectra are recorded using field modulation, double integration is required to determine the EPR intensity and hence the defect concentration. To minimise the errors associated with double integration, base line correction, finite limits of integration, etc., especially in cases where overlapping EPR spectra are present, a spectral fitting method (using a Nelder-Mead simplex algorithm (J. A. Nelder and R. Mead, The Computer Journal, 7 (1965), 308)) is employed to determine the integrated intensity of the EPR centres present in the sample of interest. This entails fitting the experimental spectra with simulated spectra of the defects present in the sample and determining the integrated intensity of each from the simulation. Experimentally it is observed that neither a Lorentzian nor Gaussian line shape provides a good fit to the experimental EPR spectra, therefore a Tsallis function is used to produce the simulated spectra (D. F. Howarth, J. A. Weil, Z. Zimpel, J. Magn. Res., 161 (2003), 215). Furthermore, in the case of low nitrogen concentrations, it is often necessary to use modulation amplitudes approaching or exceeding the line width of the EPR signals to achieve a good signal/noise ratio (enabling accurate concentration determination within a reasonable time frame). Hence pseudo-modulation is employed, with the Tsailis line shape in order to produce a good fit to the recorded. EPR spectra (J. S. Hyde, M. Pasenkiewicz-Gierula, A. Jesmanowicz, W. E. Antholine, Appl. Magn. Resor., 1 (1990), 483). Using this method the concentration can be determined with a reproducibility of better than ±5%.

The person skilled in the art would be able to determine which $N_s^0$ measurement method would be appropriate to use in any given situation.

The skilled person is familiar with the methods which can be used to distinguish between synthetic CVD diamond and synthetic HPHT diamond. The following are a number of non-limiting examples of these methods.

One method of distinguishing synthetic CVD diamond material from a synthetic diamond material synthesized using HPHT techniques is by the dislocation structure. In synthetic CVD diamond, dislocations generally thread in a direction that is roughly perpendicular to the initial growth surface of the substrate, i.e. where the substrate is a (001) substrate, the dislocations are approximately aligned parallel to the [001] direction. In synthetic diamond material synthesized using HPHT techniques, dislocations that nucleate on the surface of the seed crystal (often a surface close to {001}) typically grow in <110> directions. Thus the two types of material can be distinguished by their different dislocation structures observed, for example, in an X-ray topograph. However, obtaining X-ray topographs is an onerous task and clearly an alternative, less onerous method that enables positive distinction would be desirable.

A further method for distinguishing synthetic CVD diamond material from a synthetic diamond material synthesized using HPHT techniques is by the presence of metallic inclusions in the HPHT-synthesized material that are incorporated as a result of the synthesis process. The inclusions are comprised of the metals used as the solvent catalyst metal, e.g. Fe, Co, Ni etc. Inclusions can vary in size from less than 1 µm to more than 100 µm. Larger inclusions can be observed using a stereo-microscope (e.g. a Zeiss DV4); whilst smaller inclusion can be observed using transmitted light in a metallurgical microscope (e.g. a Zeiss "Axiophot").

A further method that can be used to provide a positive distinction between synthetic diamonds produced by CVD and HPHT methods is photoluminescence spectroscopy (PL). In the case of HPHT-synthesised material, defects containing atoms from the catalyst metals (typically transition metals) used in the synthesis process (e.g. Ni, Co, Fe etc.) are frequently present and the detection of such defects by PL positively indicates that the material has been synthesised by an HPHT method.

The absence of defects related to the presence of catalyst metal atoms in the diamond is an advantage of diamond produced by the current invention over material produced by HPHT methods as such defects can locally disrupt the Fermi level affecting the suitability of the material for use as a substrate for the fabrication of electronic devices such as FETs.

Synthetic CVD diamond material of the present invention may be identified by its unique integrated absorption and its association with $N_s^0$. The integrated absorption is measured using a UV/visible absorption spectrum of the synthetic CVD diamond material taken at room temperature. All the absorption spectra mentioned herein were collected using a Perkin Elmer Lambda-9 spectrometer. The UV/visible absorption spectra of diamond material may show characteristic bands at 360 nm and 510 nm.

The data recorded in the spectra ("the measured spectrum") were deconvolved in the following way to give information on the proportion of the measured absorption that can be attributed to $N_s^0$ and the proportion of the measured absorption that can be attributed to other defects.

a. A reflection loss spectrum was created using tabulated refractive index data and standard expressions for the reflection loss for a parallel-sided plate.

b. The reflection loss spectrum was subtracted from the measured absorbance data and an absorption coefficient spectrum is created from the resulting spectrum.

c. In order to determine the component of the measured spectrum that is attributable to $N_s^0$, an absorption spectrum for type Ib HPHT synthetic diamond (for which the absorption is attributed solely to $N_s^0$) was scaled until it is substantially removed the 270 nm peak from the measured spectrum when subtracted from it.

d. Using the visible region of the spectrum as stretching from 380 nm (i.e. 3.2618 eV) to 750 nm (i.e. 1.6527 eV), the integrated absorption in the visible region was determined for the measured spectrum (C) and for the component of it attributable to $N_s^0$ (B). The ratio of the integrated absorption in the visible region for the component attributable to $N_s^0$ and for the measured spectrum (B/C) can then be calculated. The contribution to the optical absorption in the visible region not due to $N_s^0$ is given by the value C–B.

e. In practice reflection losses are generally greater than the theoretical values and this can make it difficult to determine absolute absorption coefficient values. In order to correct for additional losses not directly related to absorption, the following routine was used. Towards lower energies it was generally the case that below a particular energy the measured absorption no longer showed significant variation with energy. Absorption coefficient data were shifted so that absorption coefficient was zero at the energy at which there was no further significant variation in absorption coefficient.

The residual spectrum can be further deconvolved in to a component proportional to $1/\lambda^3$ and two overlapping bands, one centred on 360 nm and the other centred on 510 nm. The skilled person would know how to calculate the absorption coefficients of these bands.

Synthetic CVD diamond material of the present invention may have a total integrated absorption in the visible range from 350 nm to 750 nm such that at least about 35%, alternatively at least about 40%, alternatively at least about 45%, alternatively at least about 50%, alternatively at least about 55%, alternatively at least about 60%, alternatively at least about 65%, alternatively at least about 70%, alternatively at least about 75%, alternatively at least about 80%, alternatively at least about 85%, alternatively at least about 90%, alternatively at least about 92%, alternatively at least about 94%, alternatively at least about 96%, alternatively at least about 98%, alternatively at least about 99% of the integrated absorption (in eV·cm−1) is attributable to $N_s^0$.

Preferably, for synthetic CVD diamond material of the present invention, at least about 85% of the integrated absorption between 350 nm and 750 nm is attributable to $N_s^0$.

These values of integrated absorption indicate that synthetic CVD diamond material of the present invention is similar to intrinsic diamond, having a high colour, and that this is due to a lower concentration of defects other than $N_s^0$ that absorb in the visible part of the spectrum. This shows that synthetic CVD diamond material of the present invention is of a high quality.

Synthetic CVD diamond material of the present invention may also be characterised by its photoluminescence (PL) spectrum. These are typically performed by excitation using a continuous-wave laser source employing a power between about 10 mW and about 100 mW focussed onto a diamond sample surface using a microscope objective, and detection via a high-resolution (better than about 0.5 nm) grating spectrometer. At 77 K, using 488 nm excitation of an argon-ion laser, the PL spectrum of the synthetic CVD diamond material of the present invention shows a peak between about 543.0 nm and about 543.2 nm, with an intensity ratio of this peak normalized to the 1st order diamond Raman (at 521.9 nm for this excitation wavelength) that is greater than about 0.005. The inventors believe that the peak between about 543.0 nm and about 543.2 nm is associated with the presence of oxygen in the synthesis process at an atomic fraction of at least about 0.05 relative to the atomic fraction of carbon as the peak has only been observed in such circumstances. At 77 K, using 488 nm excitation of an argon-ion laser, the PL spectrum of the synthetic CVD diamond material of the present invention also shows a second peak between about 539.9 nm and 540.1 nm. This peak is typically between $1/8^{th}$ and $1/12^{th}$ of the strength of the peak between 543.0 nm and 543.2 nm and therefore is believed to be observed only when there is a significant atomic fraction of oxygen in the synthesis environment. The composition and structure of the defects responsible for either the peak between about 543.0 nm and about 543.2 nm or the peak between about 539.9 nm and about 540.1 nm have not yet been elucidated. It is possible that these two peaks, which are evident in the synthetic CVD diamond material of the present invention, are inter-related.

Synthetic CVD diamond material of the present invention may also be indicated by its PL spectrum using the 514.5 nm excitation of an argon-ion laser. Using this type of excitation, the PL spectrum of synthetic CVD diamond material of the present invention shows two photoluminescence peaks, the first at 574.8-575.1 nm (approximately 575 nm) and the second at 636.9-637.1 nm (approximately 637 nm) such that the ratio of the integrated intensity of the 637 nm peak to the 575 nm peak exceeds about 1.0, alternatively exceeds about 1.2, alternatively exceeds about 1.4. Without wishing to be bound by theory, the first and second peaks of this PL spectrum correspond to the nitrogen vacancy defect in its neutral and negative charge states, respectively.

Furthermore, the material of the current invention shows a marked reduction in the level of the 737 nm PL line that is believed to be related to the silicon-vacancy (Si-V) defect. The reduction in the 737 nm PL line intensity is believed to occur in the absence of a specific reduction in the concentration of silicon in the synthesis environment and therefore the inventors believe that the reduction is caused by an as yet unidentified change in the silicon incorporation mechanism.

The use of photoluminescence (PL) spectroscopy to characterise defects in diamond is well known in the art. In PL the sample is exposed to photons of a particular wavelength (e.g. 514.5 nm radiation of an argon-ion laser). This excites electrons in the material to higher energy levels. The excited electrons decay back to their ground states and emit photons having wavelengths that are characteristic of the transition and that can be characterised using a spectrometer. There are numerous PL spectrometers commercially available.

Synthetic CVD diamond material of the present invention may embody IR absorption coefficients greater than (i) 0.1 cm$^{-1}$ at 1332 cm$^{-1}$ and (ii) 0.05 cm$^{-1}$ at 1344 cm$^{-1}$ using an infrared absorption spectrometer with a resolution of 1 cm$^{-1}$. These respectively indicate that the single nitrogen concentrations are (i) more than 0.55 parts per million in the positive charge state and (ii) more than 2.2 parts per million in the neutral charge state. The correlation between the absorption coefficient at 1332 cm$^{-1}$ and single substitutional nitrogen in the neutral charge state is that an absorption coefficient of 1 cm$^{-1}$ corresponds to approximately 5.5 ppm. The correlation between the absorption coefficient at 1344 cm$^{-1}$ and single substitutional nitrogen in the positive charge state is that an absorption coefficient of 1 cm$^{-1}$ corresponds to approximately 44 ppm.

Synthetic CVD diamond material of the present invention may have at least about 50%, alternatively at least about 80%, alternatively at least about 90%, alternatively at least about 95% of the volume of the synthetic CVD diamond material formed from a single growth sector. The material of the single growth sector may have $N_s^0$ levels within ±10% of the mean for greater than about 50% of the volume of the growth sector, alternatively greater than about 60% of the volume of the growth sector, alternatively greater than about 80% of the volume of the growth sector. Forming synthetic CVD diamond material from a single growth sector is advantageous as the CVD diamond material will have fewer surfaces with different crystallographic orientations (which are the surfaces corresponding to differing growth sectors). Surfaces with different crystallographic orientations exhibit strongly differential uptakes of nitrogen impurity and the synthetic CVD diamond material therefore tends to show undesirable zones with different colour, resulting from the different concentrations of $N_s^0$ in different growth sectors. Therefore, using a single growth sector will lead to higher quality synthetic CVD diamond material.

Synthetic CVD diamond material of the present invention may contain impurities other than $N_s^0$. In one embodiment, the elemental concentration of individual chemical impurities other than nitrogen and hydrogen is less than about 0.1 ppm, alternatively less than about 0.05 ppm, alternatively less than about 0.02 ppm, alternatively less than about 0.01 ppm. As used herein, "elemental concentration" means the absolute chemical concentration of the impurities referred to.

The concentration of substitutional boron may be about $1\times10^{17}$ atoms per cm$^3$ or less, alternatively about $5\times10^{16}$ atoms per cm$^3$ or less, alternatively about $1\times10^{16}$ atoms per cm$^3$ or less. The concentration of hydrogen (including the isotopes of hydrogen) may be about $1\times10^{19}$ atoms per cm$^3$ or less, alternatively about $1\times10^{18}$ atoms per cm$^3$ or less, alternatively about $1\times10^{17}$ atoms per cm$^3$ or less.

The perceived colour of an object depends on the transmittance/absorbance spectrum of the object, the spectral power distribution of the illumination source and the response curves of the observer's eyes. The CIE L*a*b* chromaticity coordinates (and therefore hue angles) quoted herein have been derived in the way described below. Using a standard D65 illumination spectrum and standard (red, green and blue) response curves of the eye (G. Wyszecki and W. S. Stiles, John Wiley, New York-London-Sydney, 1967) CIE L*a*b* chromaticity coordinates of a parallel-sided plate of diamond have been derived from its transmittance spectrum using the relationships below, between 350 nm and 800 nm with a data interval of 1 nm:

$S_\lambda$=transmittance at wavelength $\lambda$
$L_\lambda$=spectral power distribution of the illumination
$x_\lambda$=red response function of the eye
$y_\lambda$=green response function of the eye
$z_\lambda$=blue response function of the eye
$X=\Sigma_\lambda[S_\lambda x_\lambda L_\lambda]/Y_0$
$Y=\Sigma_\lambda[S_\lambda y_\lambda L_\lambda]/Y_0$
$Z=\Sigma_\lambda[S_\lambda z_\lambda L_\lambda]/Y_0$
Where $Y_0=\Sigma_\lambda y_\lambda L_\lambda$
$L^*=116(Y/Y_0)^{1/3}-16$=Lightness (for $Y/Y_0>0.008856$)
$a^*=500[(X/X_0)^{1/3}-(Y/Y_0)^{1/3}]$ (for $X/X_0>0.008856$, $Y/Y_0>0.008856$)
$b^*=200[(Y/Y_0)^{1/3}-(Z/Z_0)^{1/3}]$ (for $Z/Z_0>0.008856$)
$C^*=(a^{*2}+b^{*2})^{1/2}$=saturation
$h_{ab}$=arctan $(b^*/a^*)$=hue angle Modified versions of these equations must be used outside the limits of $Y/Y_0$, $X/X_0$ and $Z/Z_0$. The modified versions are given in a technical report prepared by the Commission Internationale de L'Eclairage (Colorimetry (1986)).

It is standard to plot a* and b* coordinates on a graph with a* corresponding to the x axis and b* corresponding to the y axis. Positive a* and b* values correspond respectively to red and yellow components of the hue. Negative a* and b* values correspond respectively to green and blue components. The positive quadrant of the graph then covers hues ranging from yellow through orange to red, with saturations (C*) given by the distance from the origin.

It is possible to predict how the a*b* coordinates of diamond with a given absorption coefficient spectrum will change as the optical path length is varied. In order to do this, the reflection loss must first be subtracted from the measured absorbance spectrum. The absorbance is then scaled to allow for a different path length and then the reflection loss is added back on. The absorbance spectrum can then be converted to a transmittance spectrum which is used to derive the CIE L*a*b* coordinates for the new thickness. In this way the dependence of the hue, saturation and lightness on optical path length can be modelled to give an understanding of how the colour of diamond with given absorption properties per unit thickness will depend on the optical path length.

L*, the lightness, forms the third dimension of the CIE L*a*b* colour space. It is important to understand the way in which the lightness and saturation vary as the optical path length is changed for diamond with particular optical absorption properties. This can be illustrated on a colour tone diagram in which L* is plotted along the y-axis and C* is plotted along the x-axis. The method described in the preceding paragraph can also be used to predict how the L*C* coordinates of diamond with a given absorption coefficient spectrum depend on the optical path length.

The C* (saturation) numbers can be divided into saturation ranges of 10 C* units and assigned descriptive terms as below.

| | |
|---|---|
| 0-10 | weak |
| 10-20 | weak-moderate |
| 20-30 | moderate |
| 30-40 | moderate-strong |
| 40-50 | strong |
| 50-60 | strong-very strong |
| 60-70 | very strong |
| 70-80+ | very very strong |

Similarly the L* numbers can be divided up into lightness ranges as follows:

| | |
|---|---|
| 5-15 | very very dark |
| 15-25 | very dark |
| 25-35 | dark |
| 35-45 | medium/dark |
| 45-55 | medium |
| 55-65 | light/medium |
| 65-75 | light |
| 75-85 | very light |
| 85-95 | very very light |

There are four basic colour tones defined by the following combinations of lightness and saturation:

| | |
|---|---|
| Bright: Light and high saturation, | Pale: Light and low saturation, |
| Deep: High saturation and dark, | Dull: Low saturation and dark. |

A hue angle of greater than 80° for a transmission pathlength of 1 mm indicates that the colour of the synthetic CVD diamond material of the present invention is dominated by the $N_s^0$, with little contribution from other colour centres in the material. In particular, synthetic CVD diamond material of the present invention, when in the form of a parallel sided plate with a thickness of approximately 1 mm, may have the following colour parameters in the CIE L*a*b* colour space:

a* between about −20 and about 1, alternatively between about −10 and about 1, alternatively between about −5 and about 1;

b* greater than about 5 and less than about 20, alternatively greater than about 10 and less than about 20;

C* (saturation) between about 0 and about 30, alternatively between about 1 and about 25, alternatively between about 2 and about 30; and L* (lightness) greater than about 40 and less than about 100, alternatively greater than about 50 and less than about 100, alternatively greater than about 60 and less than about 100.

This provides a quantitative measure the quality of synthetic CVD diamond material of the present invention. These colour properties are advantageous because they give the diamond a pure yellow colour and can be used for ornamental purposes such as gemstones for jewellery.

The diamond material of the present invention may have a hue angle for a transmission pathlength of 1 mm of about 80° or greater, alternatively about 85° or greater, alternatively about 90° or greater, alternatively about 95° or greater.

The CVD diamond material of the present invention may have a hue angle of less than about 180° for a transmission pathlength of 1 mm.

It is possible for synthetic CVD diamond material produced using a H-based plasma (e.g. using $H_2/CH_4$ source gas mixtures) to include greater than 0.5 ppm of $N_s^0$, but such synthetic CVD diamond material produced using these $H_2/CH_4$-based source gases will have extremely high levels of other defects, reducing the quality and appearance (or colour) of the material. Therefore, the synthetic CVD diamond materials of the prior art will typically have a hue angle significantly less than about 80°, and often less than 70°, for a transmission path length of 1 mm and will consequently be brown coloured.

In one embodiment, synthetic CVD diamond material of the present invention may be in the form of a freestanding entity having a thickness of greater than about 0.2 mm, alternatively greater than about 0.5 mm, alternatively greater than about 1.0 mm, alternatively greater than about 1.5 mm, alternatively greater than about 2.0 mm, alternatively greater than about 2.5 mm, alternatively greater than about 3.0 mm, alternatively greater than about 3.5 mm, alternatively greater than about 4.0 mm, alternatively greater than about 5.0 mm, alternatively greater than about 6.0 mm, alternatively greater than about 10 mm, alternatively greater than about 15 mm.

In one embodiment, synthetic CVD diamond material of the present invention may be in the form of a freestanding entity having a thickness of less than about 50 mm; alternatively less than about 45 mm; alternatively less than about 40 mm; alternatively less than about 35 mm; alternatively less than about 30 mm; alternatively less than about 25 mm alternatively less than about 20 mm.

Such thicknesses of freestanding entities made from synthetic CVD diamond material of the present invention are advantageous because they can be used in ornamental applications such as gemstones for jewellery. Such entities can also be used in diamond electronic devices, such as FETs.

In another embodiment, synthetic CVD diamond material of the present invention may be in the form of a layer attached to a diamond having different characteristics (e.g. impurity level, dislocation density, carbon isotope ratio, etc.). The layer of CVD diamond material of the present invention may have a thickness of about 0.5 mm or less, alternatively about 0.2 mm or less, alternatively about 0.1 mm or less, alternatively about 10 μm or less, alternatively about 1μm or less, alternatively about 300 nm or less, alternatively about 100 nm or less.

In another embodiment, synthetic CVD diamond material of the present invention may be in the form of a layer having a thickness of about 0.1 nm or more; alternatively about 0.2 nm or more; alternatively about 0.3 nm or more; alternatively about 0.4 nm or more; alternatively about 0.5 nm or more.

Such layers made from synthetic CVD diamond material of the present invention are advantageous because they can be used in small scale electronic devices.

Synthetic CVD diamond material of the present invention may be in the form of a doublet. A doublet is a synthetic CVD diamond material made in layered sections. The lower, larger portion is made from lower quality synthetic CVD diamond material and has a smaller layer of higher quality synthetic CVD diamond material attached to the top of it. These doublets are advantageous because they can be used in gemstone applications.

The present invention further provides, a gemstone comprising synthetic CVD diamond material of the present invention and/or made by the method of the present invention.

The present invention further provides the use of synthetic CVD diamond material according to the present invention and/or made by the method of the present invention as a gemstone.

The present invention further provides an electronic device comprising synthetic CVD diamond material of the present invention and/or made by the method of the present invention.

The present invention further provides a luminescent detector comprising a layer of diamond material of the invention that emits photoluminescence on irradiation with X-rays.

The present invention further provides the use of synthetic CVD diamond material according to the present invention and/or made by the method of the present invention in an electronic device.

The present invention provides synthetic CVD diamond material comprising $N_s^0$ at a concentration of greater than about 0.5 ppm and having a total integrated absorption in the visible range from 350 nm to 750 nm such that at least about 35% of the absorption is attributable to $N_s^0$, wherein the material optionally has one or more of the following properties:

(a) hue angle greater than about 80° for a transmission path length of 1 mm;
(b) a photoluminescence spectrum at 77 K using the 488 nm excitation of an argon-ion laser which shows a peak at from about 543.0 to about 543.2 nm, with an intensity ratio of this peak normalized to the 1st order diamond Raman (at 521.9 nm for this excitation wavelength) of greater than about 1/50 or preferably about 1/100 or more preferably about 1/200;
(c) a photoluminescence spectrum using the 514.5 nm excitation of an argon-ion laser showing two photoluminescence peaks, the first at 574.8-575.1 nm (approximately 575 nm) and the second at 636.9-637.1 nm (approximately 637 nm) such that the ratio of the integrated intensity of the 637 nm peak to the 575 nm peak exceeds about 1.0, alternatively exceeds about 1.2, alternatively exceeds about 1.4.

Therefore, in one embodiment of the present invention, there is provided synthetic CVD diamond material comprising $N_s^0$ at a concentration of greater than about 0.5 ppm and having a total integrated absorption in the visible range from 350 nm to 750 nm such that at least about 35% of the absorption is attributable to $N_s^0$, wherein the synthetic CVD diamond material has feature (a) above.

In a further embodiment of the present invention, there is provided synthetic CVD diamond material comprising $N_s^0$ at a concentration of greater than about 0.5 ppm and having a total integrated absorption in the visible range from 350 nm to 750 nm such that at least about 35% of the absorption is attributable to $N_s^0$, wherein the synthetic CVD diamond material has feature (b) above.

In a still further embodiment of the present invention, there is provided synthetic CVD diamond material comprising $N_s^0$ at a concentration of greater than about 0.5 ppm and having a total integrated absorption in the visible range from 350 nm to 750 nm such that at least about 35% of the absorption is attributable to $N_s^0$, wherein the synthetic CVD diamond material has feature (c) above.

In a still further embodiment of the present invention, there is provided synthetic CVD diamond material comprising $N_s^0$ at a concentration of greater than about 0.5 ppm and having a total integrated absorption in the visible range from 350 nm to 750 nm such that at least about 35% of the absorption is attributable to $N_s^0$, wherein the synthetic CVD diamond material has features (a) and (b) above.

In a still further embodiment of the present invention, there is provided synthetic CVD diamond material comprising $N_s^0$ at a concentration of greater than about 0.5 ppm and having a total integrated absorption in the visible range from 350 nm to 750 nm such that at least about 35% of the absorption is attributable to $N_s^0$, wherein the synthetic CVD diamond material has features (a) and (c) above.

In a further embodiment of the present invention, there is provided synthetic CVD diamond material comprising $N_s^0$ at a concentration of greater than about 0.5 ppm and having a total integrated absorption in the visible range from 350 nm to 750 nm such that at least about 35% of the absorption is attributable to $N_s^0$, wherein the synthetic CVD diamond material has features (b) and (c) above.

In a still further embodiment of the present invention, there is provided synthetic CVD diamond material comprising $N_s^0$ at a concentration of greater than about 0.5 ppm and having a total integrated absorption in the visible range from 350 nm to 750 nm such that at least about 35% of the absorption is attributable to $N_s^0$, wherein the synthetic CVD diamond material has features (a), (b) and (c) above.

BRIEF DESCRIPTION OF THE DRAWINGS

The present invention is now described, by way of illustration only, with reference to the accompanying drawings, in which.

DETAILED DESCRIPTION

EXAMPLES

Figure 1:
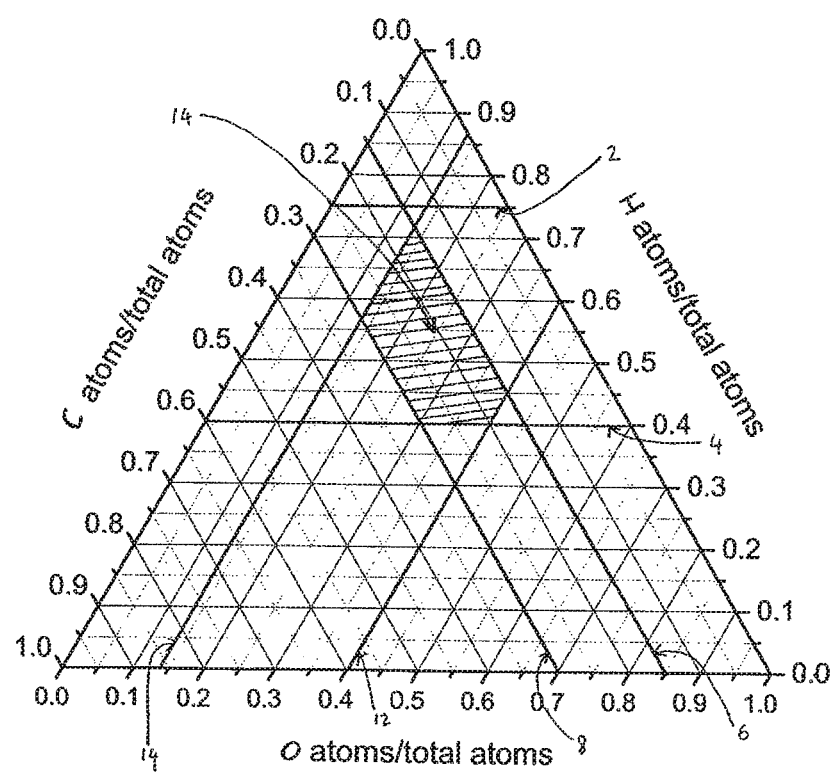
FIG. 1 shows a ternary diagram for the C—H—O space.

The foregoing examples are intended to describe the current invention without limiting the invention to the content of the examples.

Several of the examples were made using processes in which the synthesis environment was changed partway through the CVD diamond synthesis so that a $CO_2/CH_4/H_2$ process could be compared directly with a $CH_4/Ar/H_2$.

Example 1

Example 1 describes the preparation of single crystal diamond substrates suitable for the deposition of the diamond material of the invention, the deposition of a layer of diamond material using a $CH_4/H_2$ synthesis process, and the subsequent deposition of a layer of material made by the method of the invention.

1) The substrate was prepared using the following steps:
a) A single crystal diamond was selected from a stock of material (type Ia natural stones and type Ib HPHT stones) on the basis of microscopic investigation and birefringence imaging to identify a stone which was substantially free of strain and imperfections.
b) A parallel-surfaced plate with lateral dimensions of approximately 4 mm×4 mm and approximately 500 μm thick and surface $R_a$ of less than 1 nm, with all faces being within 5° of {100} surfaces, was prepared from the selected diamond using processes including laser sawing, and mechanical lapping and polishing. The processes used had previously been optimised to minimise subsurface defects using a method of a revealing plasma etch to determine the defect levels being introduced by the processing.

A substrate produced by above steps typically has a density of defects measurable after a revealing etch that is dependent primarily on the material quality and is below about $5×10^3$ defects/mm$^2$, and generally below about $10^2$ defects/mm$^2$.

2) The diamond substrate was mounted on a tungsten carrier using a Au—Ta high temperature diamond braze. This was introduced into an 896 MHz microwave plasma CVD diamond reactor.

3) The reactor was started and the substrate was subjected to a two stage pre-growth etching sequence consisting of:
(a) an in situ oxygen plasma etch performed using gas flows of 40/20/3000 sccm of $O_2/Ar/H_2$ at a pressure of about $236×10^2$ Pa (about 180 Torr) and a substrate temperature of about 716° C. for a duration of about 30 minutes;
(b) followed without interruption by a hydrogen etch with the removal of the $O_2$ from the gas flow for a duration of about 30 minutes.

4) A first layer of CVD diamond ("Sample 1, Layer 1") was deposited on the etched substrate by the introduction of $CH_4$ into the gas flow, giving a gas flow comprising 140/20/3000 sccm of $CH_4/Ar/H_2$ at a pressure of about $236×10^2$ Pa (about 180 Torr). The source gas additionally comprised an atomic fraction of nitrogen of 1.4 ppm. The substrate temperature was 840° C. Sample 1, Layer 1 has been produced by a process of a type well known in the art and thoroughly characterised, and therefore provides an in situ standard against which Sample 1, Layer 2 can be compared. The inventors have found that the optical properties of this diamond material are highly consistent and repeatable between synthesis runs.

5) A second layer, "Sample 1, Layer 2", was prepared using the following conditions: gas flows of 290/250/230 sccm for $CO_2/CH_4/H_2$, a $C_f:O_f:H_f$ ratio of 0.21:0.22:0.57, a $C_f:O_f$ ratio of 0.95:1, a pressure of $184×10^2$ Pa (138 Ton), nitrogen present at 18 ppm of atomic nitrogen equivalent, and a substrate temperature of 830° C. Of the atomic fraction of hydrogen in the source gases, 0.18 is added as $H_2$ and 0.39 is added from sources other than $H_2$. The $H_f$ value of 0.57 gives a $P_{arc}$ value of $P_{arc}=170(H_f+0.25)=139$ Torr.

The surfaces of the sample were processed sufficiently to facilitate optical characterisation of the diamond material.

UV/visible absorption spectra were recorded by illuminating one of the polished side surfaces of the sample such that the light path was entirely in either Layer 1 or Layer 2. The pathlength used for obtaining the absorption spectra was roughly the lateral dimension of the layer.

Prior to the optical characterisation, the sample was exposed to a deuterium lamp (15 Watt electrical power consumption) for 10 minutes with the sample approximately 80 mm from the filament of the bulb.

Figure 2:
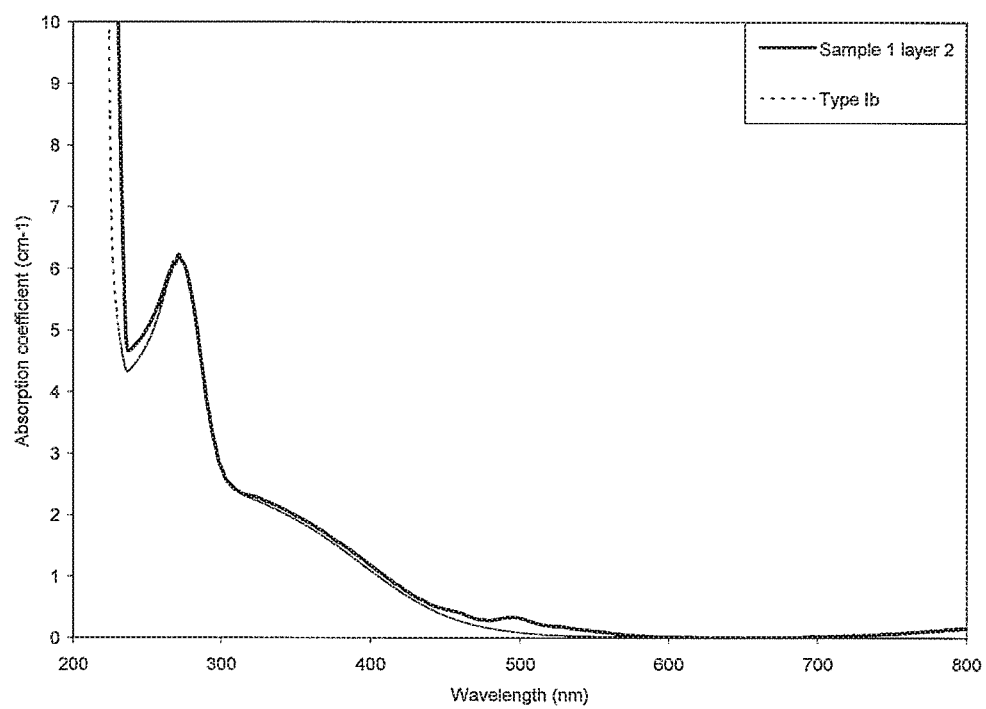
FIG. 2 shows a comparison of a UV/visible optical absorption spectrum obtained from "Sample 1, Layer 2" of Example 1 with a spectrum obtained from an HPHT Type Ib synthetic single crystal diamond.

The experimental absorption spectrum was obtained as described in the body of the text FIG. 2 shows a comparison of the UV/visible absorption spectrum for Sample 1, Layer 2 with a spectrum from an HPHT type Ib synthetic diamond.

Figure 3:
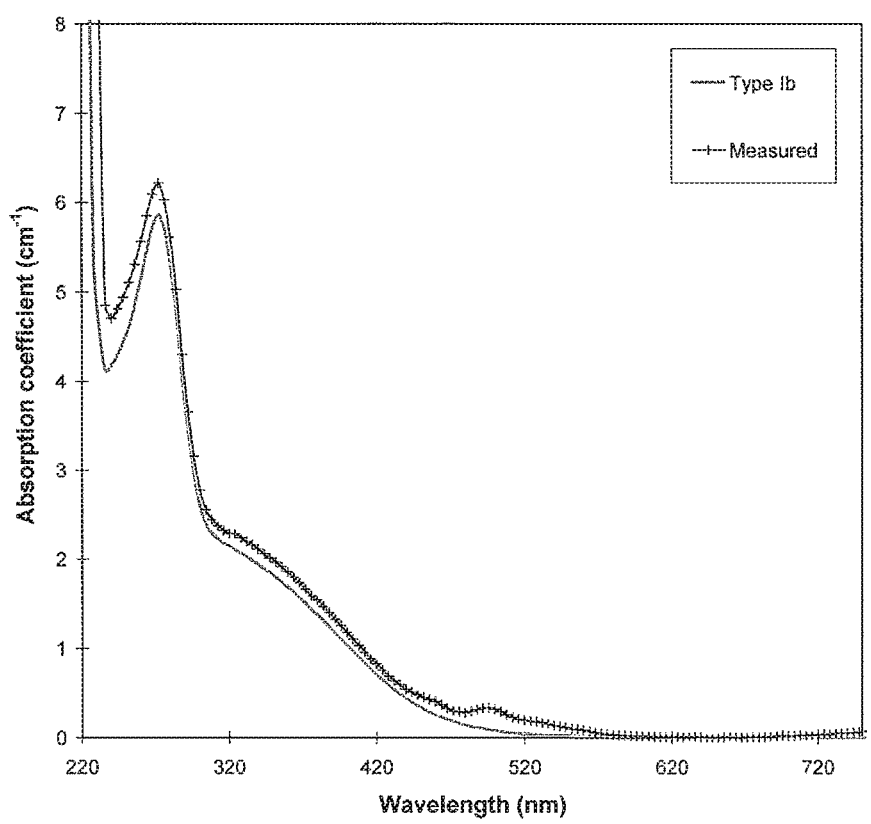
FIG. 3 shows a UV/visible optical absorption spectrum obtained from "Sample 1, Layer 2" of Example 1 deconvolved into its components.

The experimental absorption spectrum was then de-convolved, as described elsewhere in the specification, to determine the concentration of $N_s^0$. FIG. 3 shows the measured spectrum and the Type Ib component for Sample 1, Layer 2.

The measured optical absorption spectrum was integrated over the visible wavelength range (i.e. 380 nm, equivalent to 3.2168 eV, to 750 nm, equivalent to 1.6527 eV) giving a value (C) with units of eV·cm$^{-1}$. The absorption attributable to $N_s^0$ was similarly determined in eV·cm$^{-1}$ over the same wavelength range giving a value (B). The ratio B/C and the difference C−B are then calculated and are used for characterising the material.

| Sample 1 | $[N_s^0]$ (ppm) | Integrated absorption in visible (C), (eV · cm$^{-1}$) | Integrated absorption in visible attributable to $N_s^0$ (B), (eV · cm$^{-1}$) | Difference (C − B), (eV · cm$^{-1}$) | Ratio (B/C) |
|---|---|---|---|---|---|
| Layer 2 | 1.95 | 0.5989 | 0.5202 | 0.0787 | 0.87 |

The results of the optical analysis show that for "Sample 1, Layer 2", the proportion of the optical absorption over the range 350 nm to 750 nm that is due to $N_s^0$ is greater than 0.35 or 35%.

In addition, the absorption coefficients for the 360 nm and 510 nm bands were measured from the deconvolved spectrum at the peaks of the respective bands.

| | Absorption coefficient (cm$^{-1}$) | |
|---|---|---|
| Sample 1 | 360 nm band (cm$^{-1}$) | 510 nm band (cm$^{-1}$) |
| Layer 2 | 0.1 | 0.2 |

The CIE L*a*b* coordinates for an optical pathlength of 1 mm were derived from the absorption spectrum, in the way described in the detailed description of the invention, and are tabulated below.

| Sample 1 | CIE L*a*b* Coordinates at 1 mm thickness | | | | Hue angle at 1 mm optical path length (degrees) |
|---|---|---|---|---|---|
| | a* | b* | C* | L* | |
| Layer 2 | −0.1 | 2.1 | 2.1 | 85.3 | 93.6 |

"Sample 1, Layer 2", made by the method of the invention, has a hue angle for an optical pathlength of 1 mm of greater than 80° in addition to at least 35% of the optical absorption in the visible spectrum being due to $N_s^0$.

Photoluminescence (PL) spectra from Sample 1, Layer 1 and Sample 1, Layer 2 were recorded at 77 K excited using 514.5 nm light from a 50 mW Ar-ion laser. The ratio of the intensities of the peaks at 637 nm and 575 nm were 0.8 and 1.4 for layers 1 and 2 respectively.

The inventors have found that the higher the value of the ratio of the 637 nm PL line to the 575 nm PL line, the closer the optical absorption spectrum is to that of a pure Type Ib component. In a diamond containing only N and NV centres, the ratio of NV$^-$:NV$^0$ (i.e. the ratio of the intensities of the 637 nm and 575 nm lines, 637 nm:575 nm) is thought to be largely governed through the following equation:

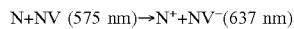

However in diamond material which is found to contain significant contributions from absorptions at around 360 nm and 510 nm, another trap(s) competes for this electron transfer. Using "X" to denote this trap(s), it is found that:

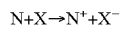

where N$^+$ can be characterized through an absorption band with a peak at the one-phonon energy of 1332 cm$^{-1}$.

This competing electron trap mechanism results in the 637 nm:575 nm intensity ratios reducing.

Example 2

The method of Example 1 was followed for steps 1) to 4)

A second layer of CVD diamond ("Sample 2, Layer 2") was deposited on the first layer by gradually changing the input gas mixture to 375/430/290 sccm of $CO_2/CH_4/H_2$ at a pressure of about 190×10$^2$ Pa (about 142 Torr) over a period of about 10 minutes. The source gas additionally comprised 20 ppm of atomic N. The substrate temperature was 840° C. The synthesis conditions for Sample 2, Layer 2 have $C_f$:$O_f$:$H_f$ atomic fractions of 0.21:0.19:0.60 and a $C_f$:$O_f$ ratio of 1.1:1. Of the atomic fraction of hydrogen in the source gases, 0.15 is added as $H_2$ and 0.45 is added from sources other than $H_2$. The $H_f$ value of 0.60 gives a Parc value of 144.5 Torr, so the operating pressure is approximately 2.5 Torr below $P_{arc}$.

On completion of the growth period, the substrate was removed from the reactor and the CVD diamond layer removed from the substrate, the top and bottom surfaces and two opposed side surfaces of the CVD diamond layer were polished sufficiently for the layer to be optically characterised. The final product was a layer of CVD diamond with a total thickness of 2.4 mm (approximately equally split between Layer 1 and Layer 2), with lateral dimensions of approximately 3.8 mm×3.8 mm.

Prior to the optical characterisation, the sample was exposed to a deuterium lamp (15 Watt electrical power consumption) for 10 minutes with the sample approximately 80 mm from the filament of the bulb.

UV/visible absorption spectra were recorded by illuminating one of the polished side surfaces of the sample such that the light path was entirely in either Layer 1 or Layer 2. Thus the pathlength used for obtaining the absorption spectra was roughly the lateral dimension of the layer.

Figure 4:
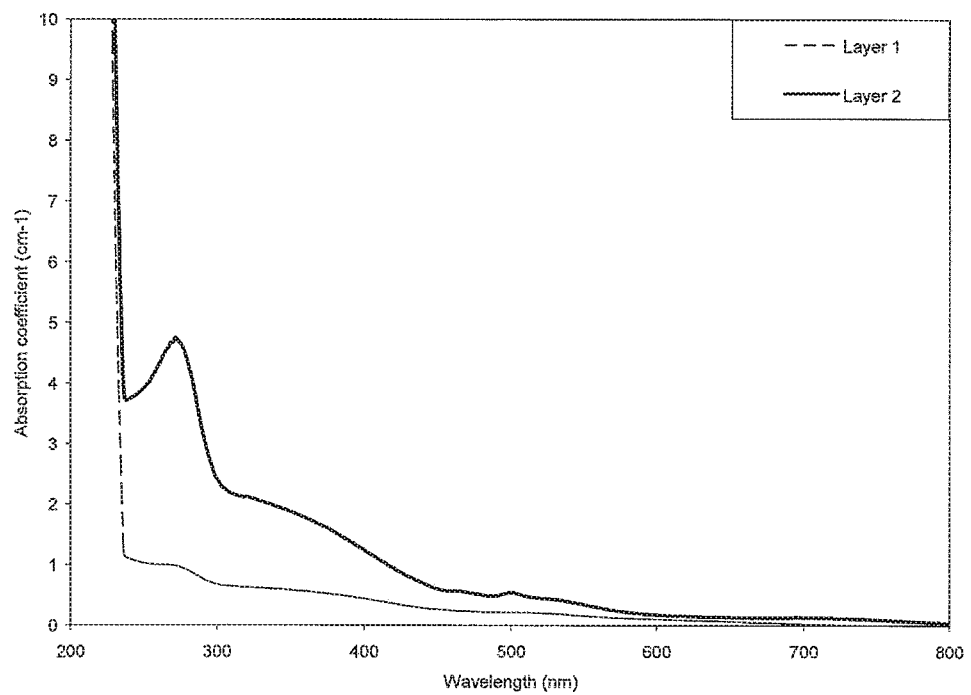
FIG. 4 shows UV/visible optical absorption spectra obtained from "Sample 2, Layer 1" and "Sample 2, Layer 2" of Example 2.
Figure 5:
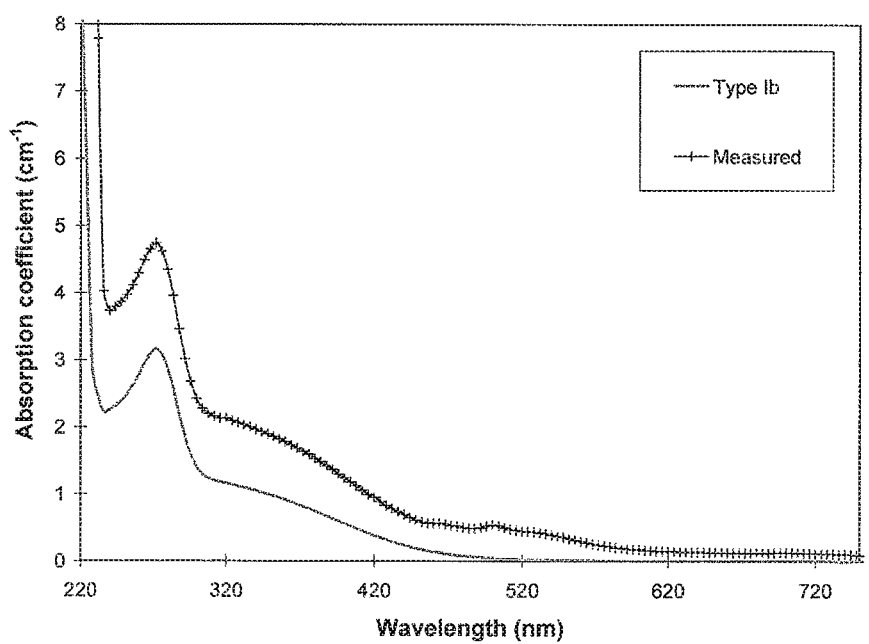
FIG. 5 shows the UV/visible optical absorption spectrum "Sample 2, Layer 2" of Example 2 deconvolved into its components.

The optical absorption spectra for Sample 2, Layer 1 and Sample 2, Layer 2 are shown in FIG. 4. The spectrum for Sample 2, Layer 2 was analysed as follows:

The Type Ib component was de-convolved from the measured spectrum (FIG. 5).

The measured optical absorption spectrum was integrated over the visible wavelength range (i.e. 380 nm, equivalent to 3.2168 eV, to 750 nm, equivalent to 1.6527 eV) giving a value with units of eV·cm$^{-1}$ (C). The absorption attributable to $N_s^0$ was similarly determined in eV·cm$^{-1}$ over the same wavelength range (B). The ratio B/C and the difference C−B are then calculated and are used for characterising the material. The values for Sample 2, Layer 2 are given below.

| Sample 2 | $[N_s^0]$ (ppm) | Integrated absorption in visible (C), (eV · cm$^{-1}$) | Integrated absorption in visible attributable to $N_s^0$ (B), (eV · cm$^{-1}$) | Difference (C − B), (eV · cm$^{-1}$) | Ratio (B/C) |
|---|---|---|---|---|---|
| Layer 2 | 1.25 | 0.737 | 0.3334 | 0.4037 | 0.45 |

For "Sample 2, Layer 2", the proportion of the absorption over the range 380 nm to 750 nm due to $N_s^0$ is 0.45 or 45%.

In addition, the absorption coefficients for the 360 nm and 510 nm bands were determined by further deconvolution of the spectrum as described elsewhere in the specification.

| | Absorption coefficient (cm$^{-1}$) | |
|---|---|---|
| Sample 2 | 360 nm band (cm$^{-1}$) | 510 nm band (cm$^{-1}$) |
| Layer 2 | 0.3 | 0.3 |

The CIE L*a*b* coordinates were derived from the absorption spectrum, in the way described in the detailed description of the invention. The values tabulated below are those calculated from these values for an optical pathlength of 1.0 mm.

| | CIE L*a*b* Coordinates | | | | Hue angle at 1.0 mm optical pathlength |
|---|---|---|---|---|---|
| Sample 1 | a* | b* | C* | L* | degrees |
| Layer 2 | 0.4 | 2.1 | 2.0 | 86.2 | 81.2 |

Figure 6:
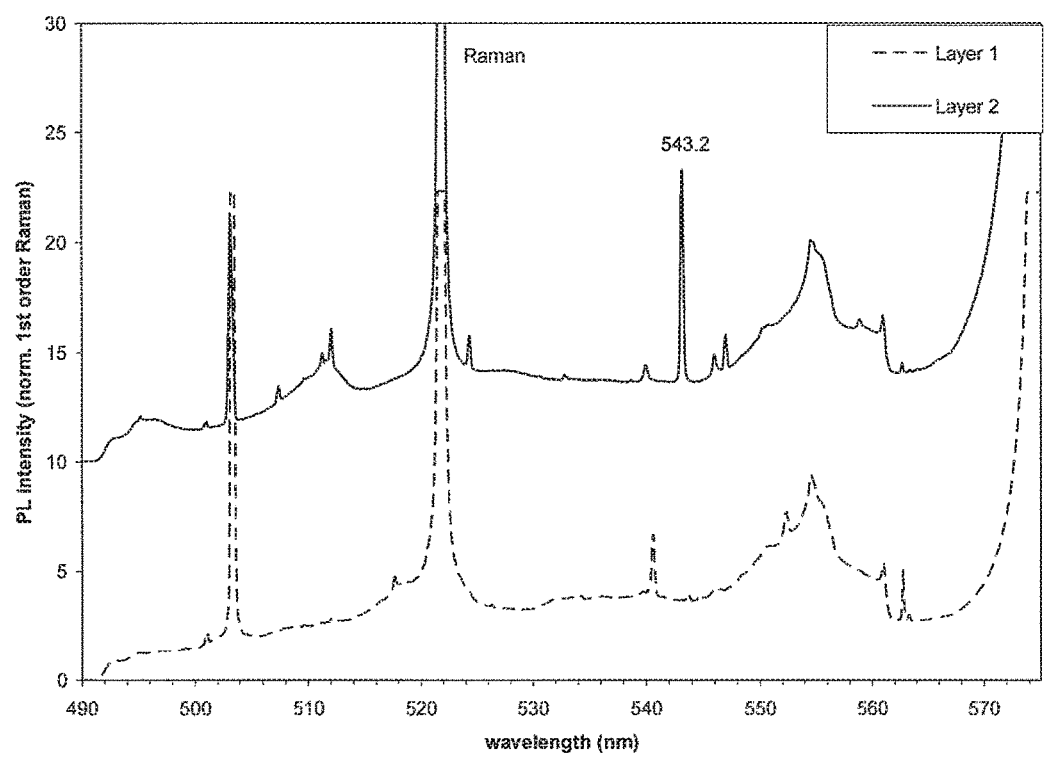
FIG. 6 shows a photoluminescence (PL) spectrum obtained at 77 K from "Sample 2, Layer 1" and "Sample 2, Layer 2" of Example 2 by exciting with radiation having a wavelength of 488.2 nm using a 50 mW Ar-ion laser.

PL spectra from Sample 2, Layer 1 and Sample 2, Layer 2, recorded at 77 K using 488.2 nm light from a 50 mW Ar-ion laser, are shown in FIG. 6. The spectra have been normalised by ratioing the integrated area beneath the first-order Raman line at 521.9 nm in FIG. 6. The PL spectrum for Sample 1, Layer 2 shows a peak at 543.1 nm that is absent in Sample 1, Layer 1, and is believed to be related to the use of large fractions of oxygen in the synthesis process.

Figure 7:
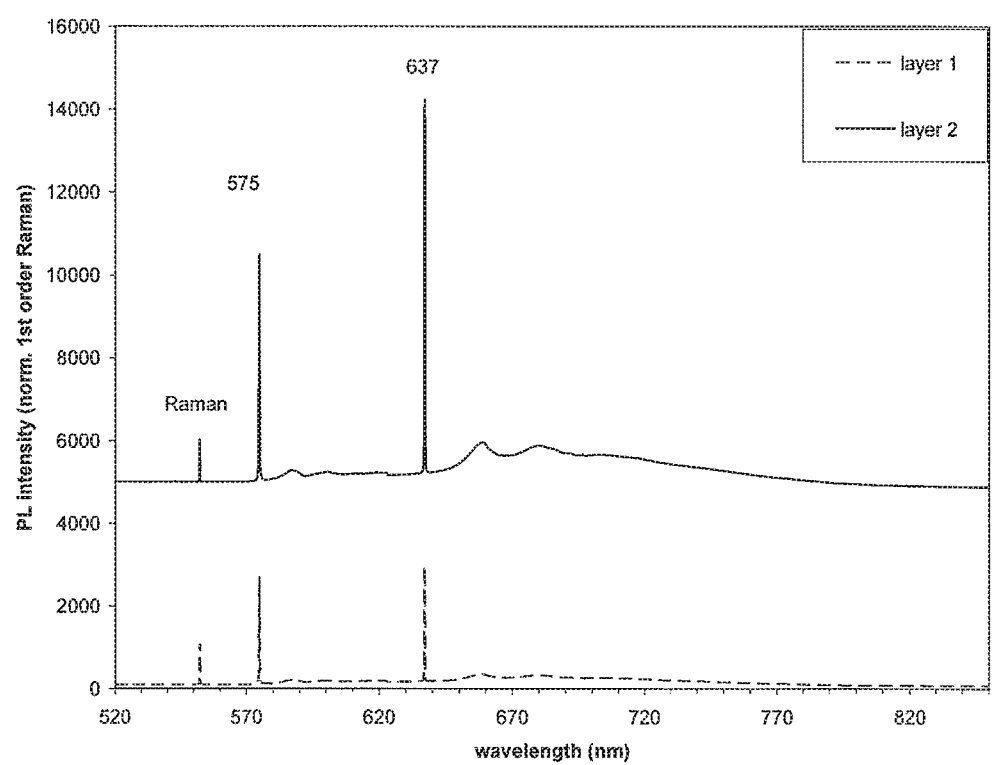
FIG. 7 shows a photoluminescence (PL) spectrum obtained at 77 K from "Sample 2, Layer 1" and "Sample 2, Layer 2" of Example 2 by exciting with radiation having a wavelength of 514.5 nm using a 50 mW Ar-ion laser.

PL spectra recorded at 77 K using 514.5 nm light from a 50 mW Ar-ion laser from Sample 2, Layer 1 and Sample 2, Layer 2, are shown in FIG. 7. The ratio of the peaks at 637 nm and 575 nm are 0.7 for Sample 2, Layer 1, and 1.1 for Sample 2, Layer 2. The higher value of this ratio for Sample 1, Layer 2 compared with Sample 2, Layer 1 indicates that Sample 2, Layer 2 has a higher concentration of $N_s^0$ in the material.

Example 3

Sample 3 was prepared using the same sequence of steps described in Example 1 except that the following conditions were used for step 5 to form "Sample 3, Layer 2": gas flows of 501/604/500 sccm for $CO_2/CH_4/H_2$, a $C_f:O_f:H_f$ ratio of 0.20:0.18:0.62, a $C_f:O_f$ ratio of 1.11:1, a pressure of 190×10$^2$ Pa (about 143 Torr), nitrogen present as 15 ppm of atomic nitrogen equivalent, and a substrate temperature of 860° C. The of the hydrogen atomic fraction of 0.62, 0.18 was added as $H_2$ and 0.44 was added in other forms (in this case as $CH_4$). The $H_f$ value of 0.62 gives a value for $P_{arc}$ of 148 Torr, so the operating pressure is 5 Torr less than $P_{arc}$.

Figure 8:
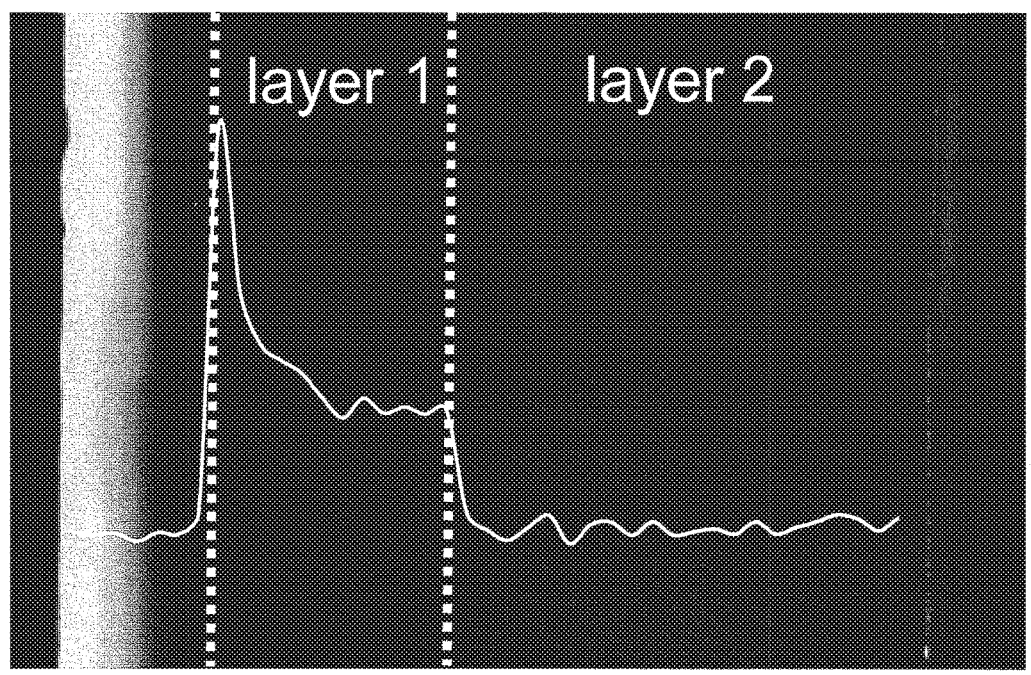
FIG. 8 shows a PL image obtained from "Sample 3" of Example 3 showing the clear distinction between "Sample 3, Layer 1" and "Sample 3, Layer 2", overlaid with the spatially resolved 737 nm PL trace from the sample.

For this sample, the amount of silicon incorporated in each of the layers was characterised using the intensity of the 737 nm PL line that is believed to be associated with the silicon-vacancy defect. FIG. 8 shows a PL image (excited with 633 nm radiation from a He—Ne laser) of the cross-section (substrate to the left-hand-side of the image) overlaid with the intensity plot for the 737 nm line. This example demonstrates that the method of the invention suppresses the uptake of Si into the material compared with $H_2/CH_4$ chemistries. The peak intensity of the 737 nm line is near the interface between substrate and the first diamond layer and is typically associated with higher levels of contaminants during the first stage of diamond growth, for example due to exposure of sources of silicon within the growth environment.

Analysis of PL spectra obtained at 77 K using 514.5 nm light from a 50 mW Ar-ion laser for "Sample 3, Layer 1" and "Sample 3, Layer 2" gave ratios of the intensities of the 637 nm and 575 nm peaks of 0.5 and 1.1 respectively.

Example 4

This comparative example demonstrates the effect that not providing some of the hydrogen atoms in the form of $H_2$ molecules has on the synthesis process.

The procedure set out in Example 1 was repeated with the following variation in conditions for step 5 to form "Sample 4, Layer 2": synthesis conditions of $CO_2/CH_4$ based plasma growth process without interruption by a ramped change in gas composition and process (pressure and power) window. The final pressure (limited by control issues due to no H2 addition) was fixed at 130×10$^2$ Pa (about 97 Ton), with a $C_f:O_f$ ratio of 1.07:1, and $C_f:O_f:H_f$ ratios of 0.246:0.229:0.525. The gas flows were 375/430 sccm of $CO_2/CH_4$. The source gas additionally comprised 20 ppm of atomic N. Substrate temperature was 810 ° C. The proportion of $H_f$ that was added in the form of H2 molecules was zero. For the $H_f$ fraction in the source gas for the synthesis of Sample 4, Layer 2, the value of $P_{arc}$ would be expected to be 132 Torr; this is substantially higher than the operating pressure of about 97 Torr and is believed by the inventors to be due to the absence of H added as $H_2$ in the source gas mixture.

Figure 9:
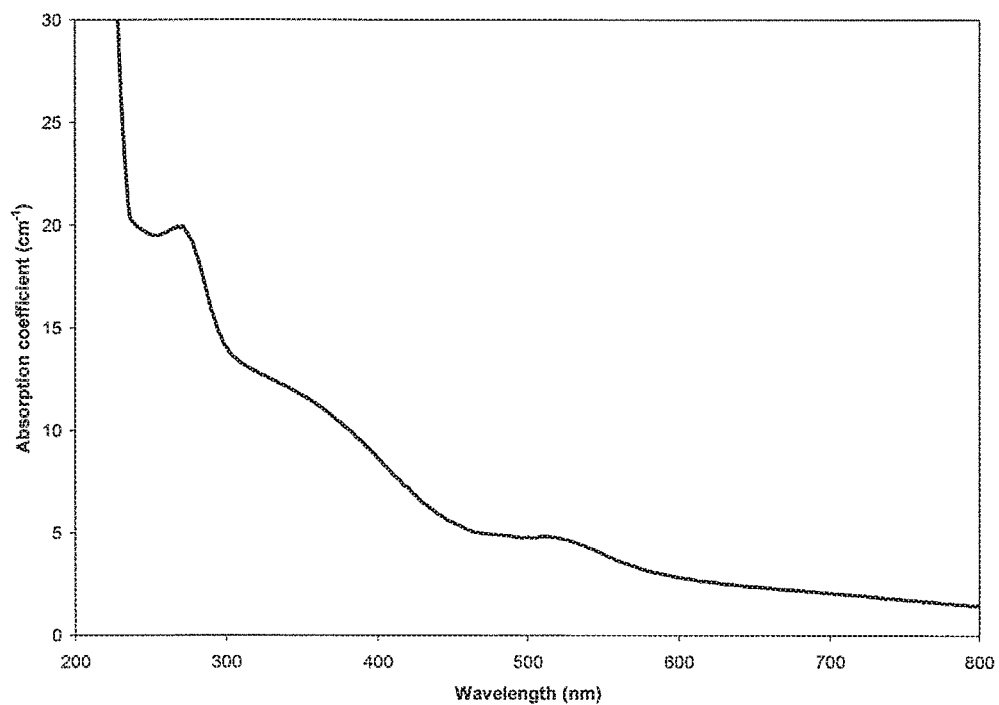
FIG. 9 shows UV/visible optical absorption spectra obtained from "Sample 4, Layer 2" of Example 4.

The UV/visible optical absorption spectrum for Sample 4, Layer 2 is shown in FIG. 9. In contrast to the previous examples grown at the higher pressures made possible by the addition of hydrogen as $H_2$ to the source gas mixture, the spectrum from Sample 4, Layer 2 shows considerable absorption in addition to the type Ib component.

The optical properties of Sample 4, Layer 2 were deconvolved, as previously described, to determine the concentration of $N_s^0$. The hue angle was measured and converted to the hue angle for an optical pathlength of 1 mm.

| | CIE L*a*b* Coordinates at 1 mm | | | | Hue angle at 1 mm optical path |
|---|---|---|---|---|---|
| Sample 4 | a* | b* | C* | L* | length (degrees) |
| Layer 2 | 1.7 | 4.8 | 5.0 | 81.3 | 70.5 |

| Sample 4 | [$N_s^0$] (ppm) | Integrated absorption in visible (C), (eV · cm$^{-1}$) | Integrated absorption in visible attributable to $N_s^0$ (B), (eV · cm$^{-1}$) | Difference (C − B), (eV · cm$^{-1}$) | Ratio (B/C) |
|---|---|---|---|---|---|
| Layer 2 | 2.8 | 5.314 | 0.75 | 4.564 | 0.14 |

The ratio B/C of 0.14 means that the proportion of the optical absorption in the visible region that is due to $N_s^0$ is only 0.14 or 14%, very much less than for those samples prepared by the method of the invention, demonstrating the importance of $H_2$ and the desirability of operating at high pressures.

The ratio of the peaks at 637 nm and 575 nm is 0.7 for Sample 4, Layer 1, and 1.0 for Sample 4, Layer 2.

In addition, the absorption coefficients for the 360 nm and 510 nm bands were determined by further deconvolution of the measured spectrum as described elsewhere in this specification.

| | Absorption coefficient (cm$^{-1}$) | |
|---|---|---|
| Sample 4 | 360 nm band (cm$^{-1}$) | 510 nm band (cm$^{-1}$) |
| Layer 2 | 3.2 | 1.5 |

Example 5

This example demonstrates that provided the atomic fractions of O, C and H in the source gas are the same, the optical properties of the diamond material that is produced will be substantially similar.

The methodology used in steps 1) to 3) of Example 1 was repeated to produce two further samples, referred to as "Sample 5, Layer 2" and "Sample 6, Layer 2". The starting gas compositions for Sample 5, Layer 2 and Sample 6, Layer 2 are summarized in the table below (gas flows in sccm). The table also shows the fractions of C, H and O in the gas phase.

| | Flow, sccm | | | | | Proportion, atomic fraction | | |
|---|---|---|---|---|---|---|---|---|
| Sample | CO$_2$ | CO | H$_2$ | CH$_4$ | Total | C | H | O |
| Sample 5, Layer 2 | 500 | 0 | 500 | 590 | 1590 | 0.20 | 0.62 | 0.18 |
| Sample 6, Layer 2 | 0 | 614 | 902 | 75 | 1591 | 0.20 | 0.62 | 0.18 |

The starting gases were chosen to result in the same C, H and O atomic fractions in the plasma. The $C_f$:$H_f$ ratio is 1.11:1. For both samples, thick single crystal diamond bodies were produced (3.7 mm for Sample 5 and 3.6 mm for Sample 6), grown at a gas pressure of $170 \times 10^2$ Pa (approximately 127 Torr), with the source gas also comprising 14 ppm of equivalent atomic nitrogen. In this case $P_{arc}$ for $H_f = 0.62$ is 148 Torr.

After completion of the synthesis process, Sample 5 and Sample 6 were processed such that they could be optically characterised. UV-visible absorption spectra were obtained. The optical absorption spectrum was deconvolved, as described elsewhere in this specification, to determine the concentration of $N_s^0$. The absorption coefficients for the 360 nm and 510 nm bands were measured at the peaks of the respective bands. The key parameters are given in the table below.

| Sample | $N_s^0$ (ppm) | 360 nm band (cm$^{-1}$) | 510 nm band (cm$^{-1}$) |
|---|---|---|---|
| Sample 5 | 1.5 | 0.5 | 0.45 |
| Sample 6 | 1.2 | 0.4 | 0.35 |

The deconvolution and absorption coefficients of the optical absorption spectrum show that different gas mixtures give essentially the same result in terms of the absorption due to each of the components.

PL spectra were obtained from Sample 5 and Sample 6 using 514.5 nm excitation from an Ar-ion laser. The ratio of the peaks at 637 nm and 575 nm are 0.94 for Sample 5 and 0.84 for Sample 6.

Figure 10:
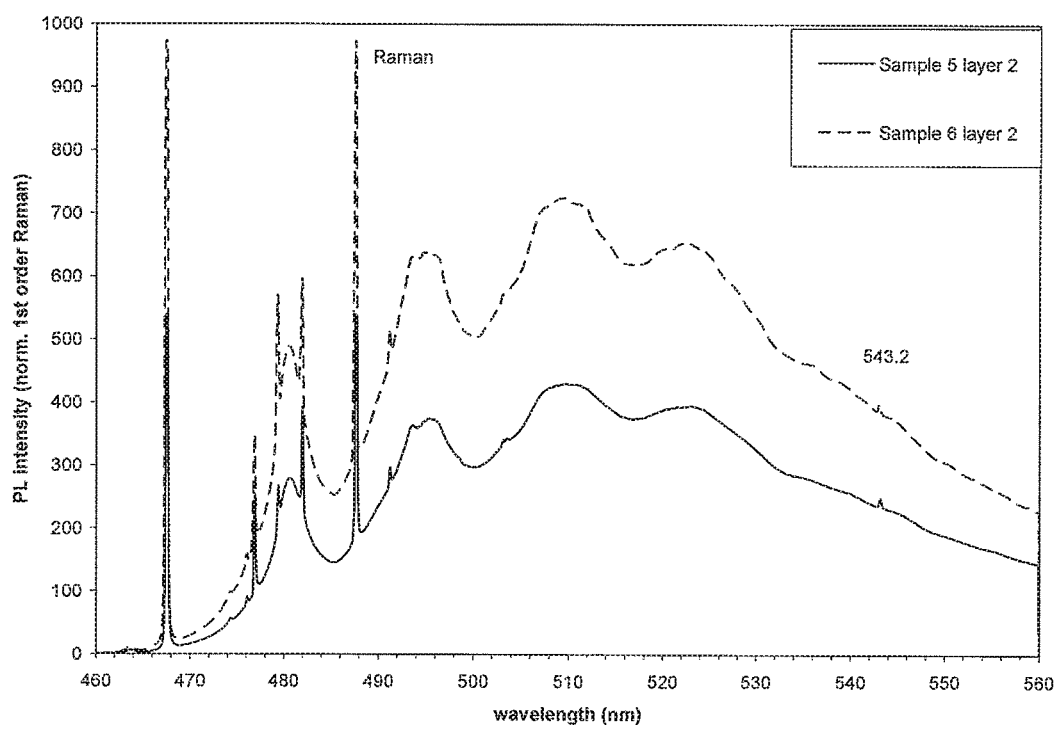
FIG. 10 shows a PL spectra obtained from "Sample 5, Layer 2" and "Sample 6, Layer 2" of Example 5 obtained by exciting with radiation having a wavelength of 458 nm.

PL spectra obtained from Sample 5, Layer 2 and Sample 6, Layer 2 using 458 nm excitation are shown in FIG. 10. Both the characteristics and the relative intensities of the spectral features are very similar; similar results were found at other PL excitation wavelengths studied (325 nm, 488 nm, 515 nm and 660 nm).

Figure 11:
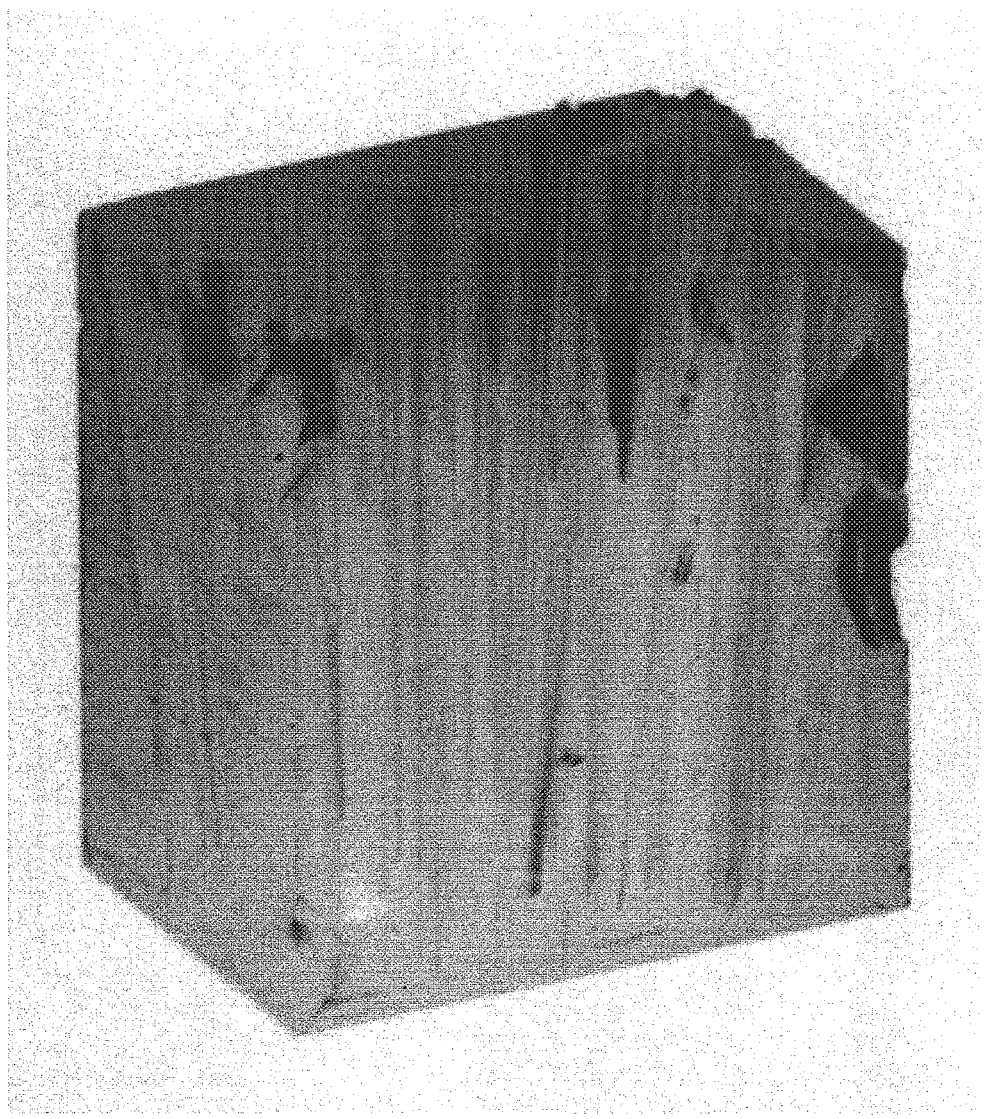
FIG. 11 shows a projection X-ray topograph obtained from "Sample 6" of Example 5.

A projection X-ray topograph of Sample 6 is shown in FIG. 11. There is little X-ray contrast indicating high crystalline quality and low dislocation density. This material property makes the material suitable for some optical and mechanical applications.

Example 6

In this example, the variation of the CIELAB parameters as a function of optical path length is shown. These results are derived from the model described and referred to in the specification.

In this case, the sample was produced according to Example 1, Layer 2 and the absorption spectrum required for calculating the CIE L*a*b* coordinates was obtained from a 1.37 mm thick sample.

| | Thickness (mm) | | | | | | | | |
|---|---|---|---|---|---|---|---|---|---|
| | 0.5 | 1 | 1.5 | 2 | 3 | 4 | 5 | 6 | 10 |
| L* | 86.4 | 85.3 | 84.3 | 83.4 | 81.4 | 79.5 | 77.6 | 75.8 | 68.8 |
| a* | −0.1 | −0.1 | −0.2 | −0.2 | −0.3 | −0.3 | −0.2 | −0.2 | 0.4 |
| b* | 1.1 | 2.1 | 3.2 | 4.2 | 6.1 | 7.9 | 9.6 | 11.2 | 16.6 |
| c* | 1.1 | 2.1 | 3.2 | 4.2 | 6.1 | 7.9 | 9.6 | 11.2 | 16.6 |
| Hue angle, ° | 93.9 | 93.6 | 93.4 | 93.1 | 92.5 | 91.9 | 91.4 | 90.8 | 88.8 |

It can be seen that, in particular, the hue angle is greater than 80° for all the thicknesses where it has been calculated.

The invention claimed is:

1. A chemical vapour deposition (CVD) method for synthesizing diamond material on a substrate in a synthesis environment, said method comprising:
   providing the substrate;
   providing a source gas;
   dissociating the source gas; and
   allowing homoepitaxial diamond synthesis on the substrate;
   wherein the synthesis environment comprises nitrogen at an atomic concentration of from about 0.4 ppm to about 50 ppm; and
   and wherein the source gas comprises:
   a) an atomic fraction of hydrogen, $H_f$, from about 0.40 to about 0.75;
   b) an atomic fraction of carbon, $C_f$, from about 0.15 to about 0.30;
   c) an atomic fraction of oxygen, $O_f$, from about 0.13 to about 0.40;
   wherein $H_f C_f O_f = 1$;
   wherein the ratio of atomic fraction of carbon to the atomic fraction of oxygen, $C_f$:$O_f$, satisfies the ratio of about 0.45:1 < $C_f$:$O_f$ < about 1.25:1;
   wherein the source gas comprises hydrogen atoms added as hydrogen molecules, $H_2$, at an atomic fraction of the total number of hydrogen, oxygen and carbon atoms present of between 0.05 and 0.40; and
   wherein the atomic fractions $H_f$, $C_f$ and $O_f$ are fractions of the total number of hydrogen, oxygen and carbon atoms present in the source gas.

2. The method according to claim 1, wherein the process is carried out at a pressure greater than $P_{lower}$ Torr, where $P_{lower} = P_{arc} - Y$ and $P_{arc} = 170(H_f + 0.25) + X$, where Y=50 Torr and X is from about 20 to about −50 and $P_{arc}$ is the pressure of the onset of unipolar arcing in the process.

3. The method according to claim 1, wherein the source gas is dissociated by microwaves.

4. The method according to claim 3, wherein the frequency of the microwaves is from about 800 MHz to about 1000 MHz.

5. The method according to claim 1, wherein the substrate is maintained at a temperature of from about 750° C. to about 1000° C.

* * * * *